(12) United States Patent
Murakoshi et al.

(10) Patent No.: US 11,871,574 B2
(45) Date of Patent: Jan. 9, 2024

(54) SEMICONDUCTOR MEMORY DEVICE AND METHOD OF MANUFACTURING THE SAME

(71) Applicant: Kioxia Corporation, Tokyo (JP)

(72) Inventors: Atsushi Murakoshi, Yokohama (JP); Tomoya Kawai, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 113 days.

(21) Appl. No.: 17/472,094

(22) Filed: Sep. 10, 2021

(65) Prior Publication Data

US 2022/0302140 A1 Sep. 22, 2022

(30) Foreign Application Priority Data

Mar. 22, 2021 (JP) ................................ 2021-046802

(51) Int. Cl.
*H10B 43/35* (2023.01)
*H10B 43/10* (2023.01)
*H10B 43/27* (2023.01)

(52) U.S. Cl.
CPC ............. *H10B 43/35* (2023.02); *H10B 43/10* (2023.02); *H10B 43/27* (2023.02)

(58) Field of Classification Search
CPC ......... H01L 27/11563; H01L 29/40117; G11C 27/005; G11C 16/0466; G11C 11/5671; H10B 43/00; H10B 10/00

(Continued)

(56) References Cited

U.S. PATENT DOCUMENTS 9,000,410 B2 * 4/2015 Kubo ................... H10N 70/841
257/3
9,230,979 B1 * 1/2016 Pachamuthu .......... H10B 43/50
(Continued)

FOREIGN PATENT DOCUMENTS

JP 3637325 B2 * 4/2005
JP 2008-60431 A 3/2008
(Continued)

OTHER PUBLICATIONS

Nogami, T. et al., "Through-Cobalt Self Forming Barrier (tCoSFB) for Cu/ULK Beol: A Novel Concept for Advanced Technology Nodes," IEDM15-181-184, 2015 IEEE, 4 pages.

*Primary Examiner* — Marcos D. Pizarro
*Assistant Examiner* — Li-Chun Tung
(74) *Attorney, Agent, or Firm* — Oblon, McClelland, Maier & Neustadt, L.L.P.

(57) ABSTRACT

A semiconductor memory device according to an embodiment includes: a first interlayer insulating layer and a second interlayer insulating layer that are arranged in a first direction; a gate electrode layer provided between the first interlayer insulating layer and the second interlayer insulating layer; a semiconductor layer extending in the first direction and facing the gate electrode layer in a second direction intersecting the first direction; a first insulating layer provided between the gate electrode layer and the semiconductor layer; a charge storage layer provided between the gate electrode layer and the first insulating layer and containing a metal element; a second insulating layer provided between the gate electrode layer and the charge storage layer; and a first region provided between the charge storage layer and the first insulating layer and containing manganese (Mn), silicon (Si), and oxygen (O).

11 Claims, 25 Drawing Sheets

(58) Field of Classification Search
USPC .......................................................... 257/314
See application file for complete search history.

(56) References Cited

U.S. PATENT DOCUMENTS

| | | | |
|---|---|---|---|
| 9,478,643 B2 | 10/2016 | Hopkins | |
| 9,646,975 B2 * | 5/2017 | Peri | ........................ H10B 43/27 |
| 9,666,281 B2 | 5/2017 | Sakakibara | |
| 10,141,322 B2 | 11/2018 | Simsek-Ege et al. | |
| 2017/0263613 A1 | 9/2017 | Murakoshi et al. | |
| 2019/0259774 A1 | 8/2019 | Murakoshi et al. | |
| 2019/0273092 A1 | 9/2019 | Sasaki et al. | |
| 2019/0296234 A1 * | 9/2019 | Yoshimura | ............ H10B 63/845 |
| 2020/0144308 A1 * | 5/2020 | Yakubo | ............... H01L 27/1211 |
| 2020/0176033 A1 * | 6/2020 | Hosotani | ................ H01L 23/481 |
| 2020/0328229 A1 * | 10/2020 | Kim | ........................ H10B 41/27 |
| 2021/0111185 A1 * | 4/2021 | Wang | ................ H01L 29/40117 |
| 2021/0257380 A1 * | 8/2021 | Xue | ........................ H10B 43/27 |

FOREIGN PATENT DOCUMENTS

| | | |
|---|---|---|
| JP | 2017-163044 A | 9/2017 |
| JP | 2019-145635 A | 8/2019 |
| TW | 201407841 A | 2/2014 |

\* cited by examiner

SEMICONDUCTOR MEMORY DEVICE AND METHOD OF MANUFACTURING THE SAME

CROSS-REFERENCE TO RELATED APPLICATION

This application is based upon and claims the benefit of priority from Japanese Patent Application No. 2021-046802, filed on Mar. 22, 2021, the entire contents of which are incorporated herein by reference.

FIELD

Embodiments described herein relate generally to a semiconductor memory device and a method of manufacturing the same.

BACKGROUND

A three-dimensional NAND flash memory in which memory cells are three-dimensionally disposed achieves high integration and low cost. A memory cell of a three-dimensional NAND flash memory includes a charge storage layer for retaining charges. In order to improve the performance of a three-dimensional NAND flash memory, it has been studied application of a layer containing a metal element to the charge storage layer. When a layer containing a metal element is applied to the charge storage layer, there is a concern that the metal element contained in the charge storage layer is diffused and the reliability of the three-dimensional NAND flash memory is deteriorated.

DETAILED DESCRIPTION

Figure 1:
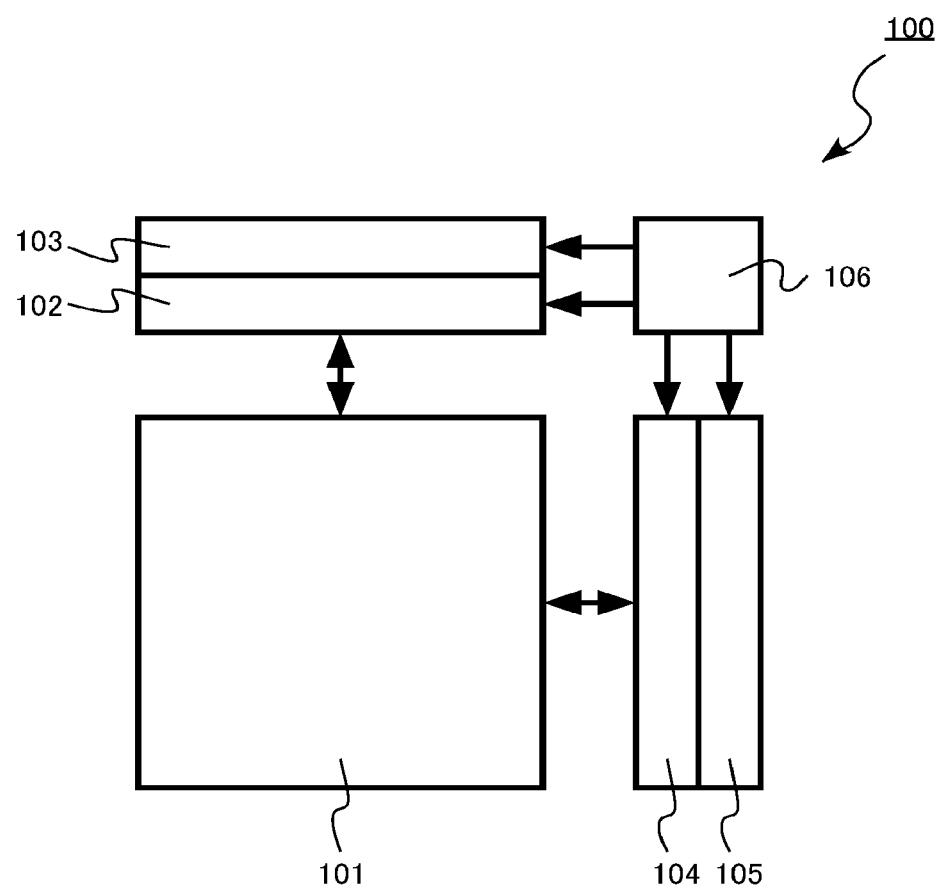
FIG. 1 is a semiconductor memory device according to an embodiment.

A semiconductor memory device according to an embodiment includes: a first interlayer insulating layer and a second interlayer insulating layer arranged in a first direction; a gate electrode layer provided between the first interlayer insulating layer and the second interlayer insulating layer; a semiconductor layer extending in the first direction and facing the gate electrode layer in a second direction intersecting the first direction; a first insulating layer provided between the gate electrode layer and the semiconductor layer; a charge storage layer provided between the gate electrode layer and the first insulating layer and containing a metal element; a second insulating layer provided between the gate electrode layer and the charge storage layer; and a first region provided between the charge storage layer and the first insulating layer and containing manganese (Mn), silicon (Si), and oxygen (O).

An embodiment will be described below with reference to the drawings. In the following description, the identical or similar members are given the identical reference numerals, and description of the members once described will be omitted as appropriate.

In the present description, the term "up" or "down" are sometimes used for convenience. The term "up" or "down" is merely a term indicating a relative positional relationship in the drawings, and is not a term defining a positional relationship with respect to gravity.

For qualitative analysis and quantitative analysis of the chemical composition of the members constituting the semiconductor memory device in the present description, it is possible to use, for example, secondary ion mass spectroscopy (SIMS), energy dispersive X-ray spectroscopy (EDX), or electron energy loss spectroscopy (EELS). For example, a transmission electron microscope (TEM) can be used to measure the thickness of the members constituting the semiconductor memory device and the distance between the members. For identification of the constituent substances of the members constituting the semiconductor memory device and comparison of the abundance ratio, it is possible to use, for example, a transmission electron microscope, X-ray diffraction (XRD), electron beam diffraction (EBD), X-ray photoelectron spectroscopy (XPS), or synchrotron radiation X-ray absorption fine structure (XAFS).

A semiconductor memory device according to an embodiment includes: a first interlayer insulating layer and a second interlayer insulating layer that are arranged in a first direction; a gate electrode layer provided between the first interlayer insulating layer and the second interlayer insulating layer; a semiconductor layer extending in the first direction and facing the gate electrode layer in a second direction intersecting the first direction; a first insulating layer provided between the gate electrode layer and the semiconductor layer; a charge storage layer provided between the gate electrode layer and the first insulating layer and containing a metal element; a second insulating layer provided between the gate electrode layer and the charge storage layer; and a first region provided between the charge storage layer and the first insulating layer and containing manganese (Mn), silicon (Si), and oxygen (O).

The semiconductor memory device of the embodiment is a three-dimensional NAND flash memory 100. In the three-dimensional NAND flash memory 100, a layer containing a metal element is applied to the charge storage layer.

FIG. 1 is a block diagram of the semiconductor memory device according to the embodiment. FIG. 1 shows a circuit configuration of the three-dimensional NAND flash memory 100 of the embodiment. As shown in FIG. 1, the three-dimensional NAND flash memory 100 includes a memory cell array 101, a word line driver circuit 102, a row decoder circuit 103, a sense amplifier circuit 104, a column decoder circuit 105, and a control circuit 106.

Figure 2:
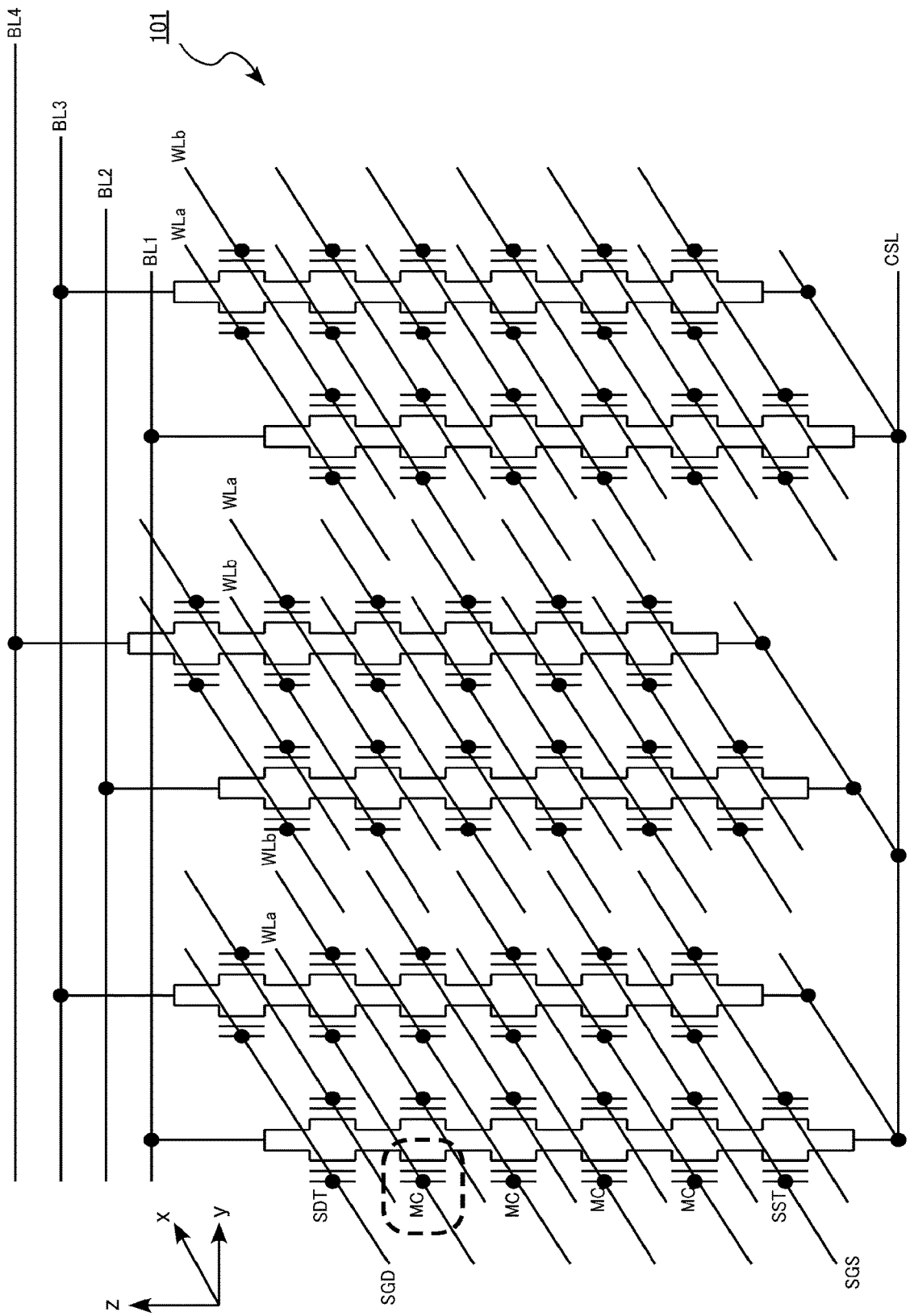
FIG. 2 is an equivalent circuit diagram of a memory cell array of the semiconductor memory device of the embodiment.

FIG. 2 is an equivalent circuit diagram of the memory cell array of the semiconductor memory device of the embodiment. FIG. 2 schematically shows a wiring structure in the memory cell array 101. The memory cell array 101 of the embodiment includes a three-dimensional structure in which a plurality of memory cells MC are three-dimensionally disposed.

Hereinafter, the z direction shown in FIG. 2 is an example of the first direction. The y direction is an example of the second direction. The x direction is an example of the third direction. The y direction intersects the x direction. The z direction intersects the x direction and the y direction. For example, the x direction and the y direction are orthogonal. For example, the z direction, the x direction, and the y direction are orthogonal. The direction opposite to the z direction is also regarded as the first direction. The direction opposite to the y direction is also regarded as the second direction. The direction opposite to the x direction is also regarded as the third direction.

As shown in FIG. 2, the memory cell array 101 includes the plurality of memory cells MC, a source selection transistor SST, a drain selection transistor SDT, a plurality of word lines WLa and WLb, a plurality of bit lines BL1 to BL4, a common source line CSL, a source selection gate line SGS, and a plurality of drain selection gate lines SGD.

The plurality of memory cells MC are connected in series in the z direction. The plurality of memory cells MC are connected between the source selection transistor SST and the drain selection transistor SDT.

The memory cell MC stores data corresponding to the amount of charge stored in the charge storage layer. The threshold voltage of the transistor of the memory cell MC varies depending on the amount of charge stored in the charge storage layer. When the threshold voltage of the transistor varies, the on-state current of the transistor varies. For example, if a state where the threshold voltage is high and the on-state current is low is defined as data "0" and a state where the threshold voltage is low and the on-state current is high is defined as data "1", the memory cell MC can store 1-bit data of "0" and "1".

The word lines WLa and WLb extend in the x direction. The word lines WLa and WLb are connected to the gate electrode of the memory cell MC. The word lines WLa and WLb control the gate voltage of the memory cell MC.

The word line WLa and the word line WLb are electrically separated. The word line WLa and the word line WLa are electrically connected. The word line WLb and the word line WLb are electrically connected.

The source selection transistor SST is electrically connected to the common source line CSL. The source selection transistor SST is controlled by a voltage applied to the source selection gate line SGS.

The drain selection transistor SDT is connected to BL1 to BL4. The drain selection transistor SDT is controlled by a voltage applied to the drain selection gate line SGD.

The plurality of word lines WLa and WLb are electrically connected to the word line driver circuit 102. The plurality of bit lines BL1 to 4 are connected to the sense amplifier circuit 104.

The row decoder circuit 103 includes a function of selecting the word lines WLa and WLb in accordance with a row address signal having been input. The word line driver circuit 102 includes a function of applying a predetermined voltage to the word lines WLa and WLb selected by the row decoder circuit 103.

The column decoder circuit 105 includes a function of selecting the bit line BL in accordance with a column address signal having been input. The sense amplifier circuit 104 includes a function of applying a predetermined voltage to the bit line BL selected by the column decoder circuit 105. It includes a function of detecting and amplifying the current or voltage flowing through the selected bit line BL.

The control circuit 106 includes a function of controlling the word line driver circuit 102, the row decoder circuit 103, the sense amplifier circuit 104, the column decoder circuit 105, and other circuits that are not illustrated.

The circuits such as the word line driver circuit 102, the row decoder circuit 103, the sense amplifier circuit 104, and the column decoder circuit 105 are configured by, for example, a transistor and a wiring layer using a semiconductor layer that is not illustrated.

For example, in FIG. 2, when data stored in the memory cell MC enclosed by a broken line is read, a read voltage is applied to the word line WLa connected to the gate electrode of the memory cell MC. When the transistor of the memory cell MC is turned on, a current flows between the common source line CSL and the bit line BL1. Data stored in the memory cell MC is determined based on a current flowing from the common source line CSL between the common source line CSL and the bit line BL1.

For example, the sense amplifier circuit 104 amplifies the current flowing through the bit line BL1, and the control circuit 106 determines data stored in the memory cell MC. Alternatively, the sense amplifier circuit 104 amplifies voltage variation of the bit line BL1, and the control circuit 106 determines the data stored in the memory cell MC.

FIG. 2 illustrates a case of four memory cells MC connected in series and a case of four bit lines. However, the number of memory cells MC connected in series and the number of bit lines are not limited to four.

Figure 3:
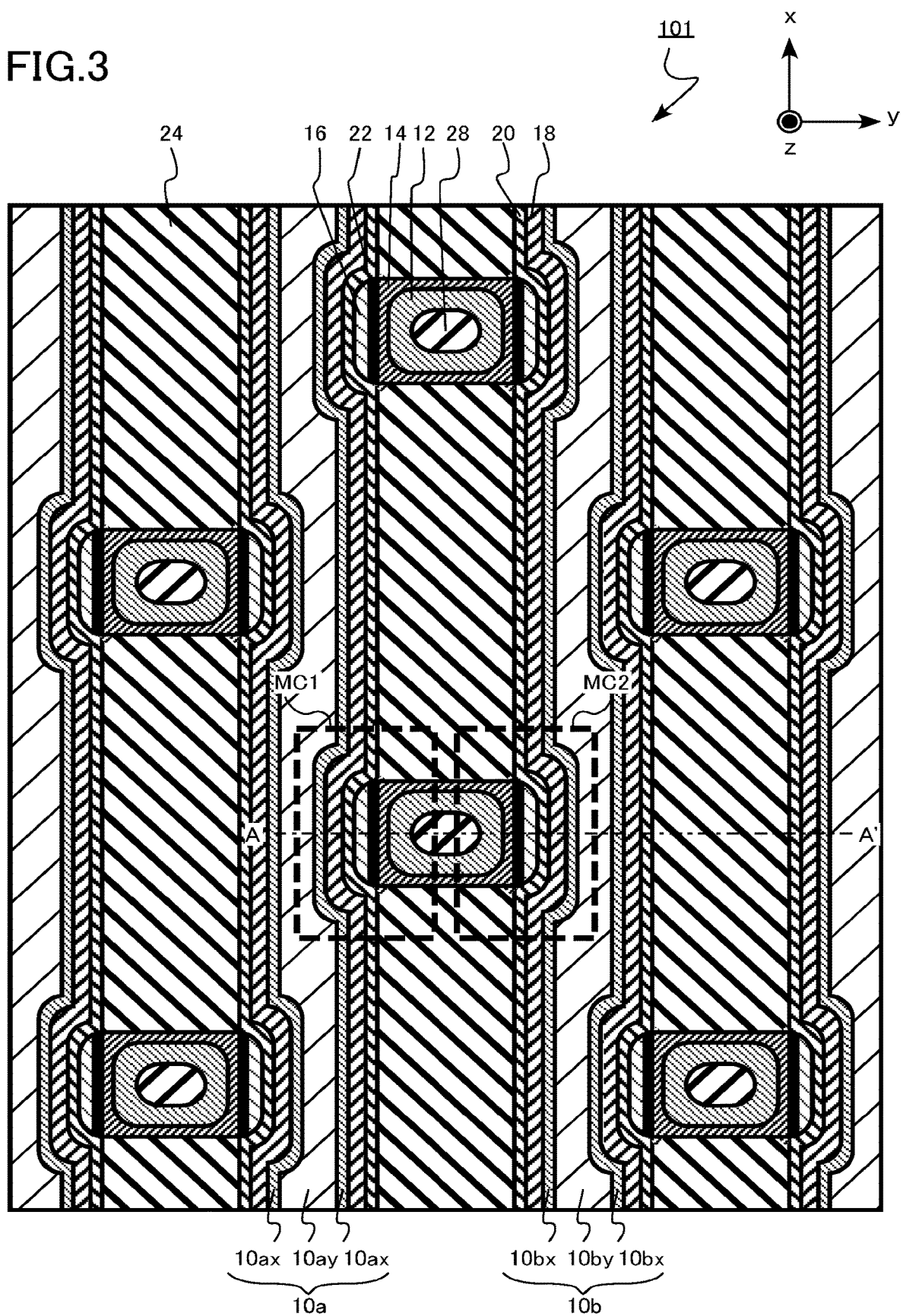
FIG. 3 is a schematic cross-sectional view of a part of the memory cell array of the semiconductor memory device of the embodiment.
Figure 4:
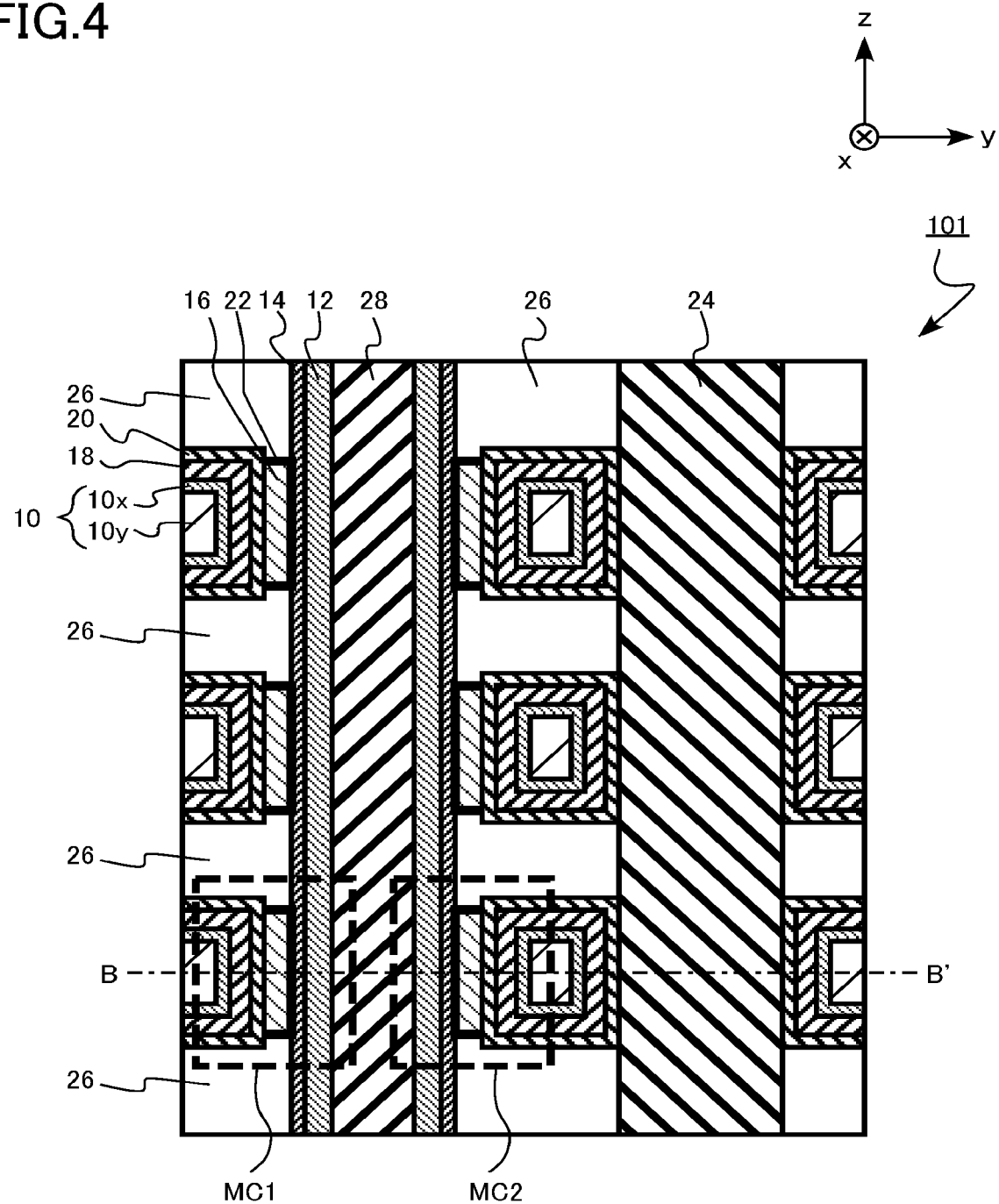
FIG. 4 is a schematic cross-sectional view of a part of the memory cell array of the semiconductor memory device of the embodiment.

FIGS. 3 and 4 are schematic cross-sectional views of a part of the memory cell array of the semiconductor memory device of the embodiment. FIG. 3 shows the xy cross section of the memory cell array 101. FIG. 3 shows a cross section including the BB' plane of FIG. 4. FIG. 4 shows the yz cross section of the memory cell array 101. FIG. 4 shows the AA' cross section of FIG. 3.

In FIGS. 3 and 4, a region enclosed by a broken line is one memory cell MC. FIGS. 3 and 4 illustrate memory cells MC1 and MC2 adjacent in the y direction.

Figure 5:
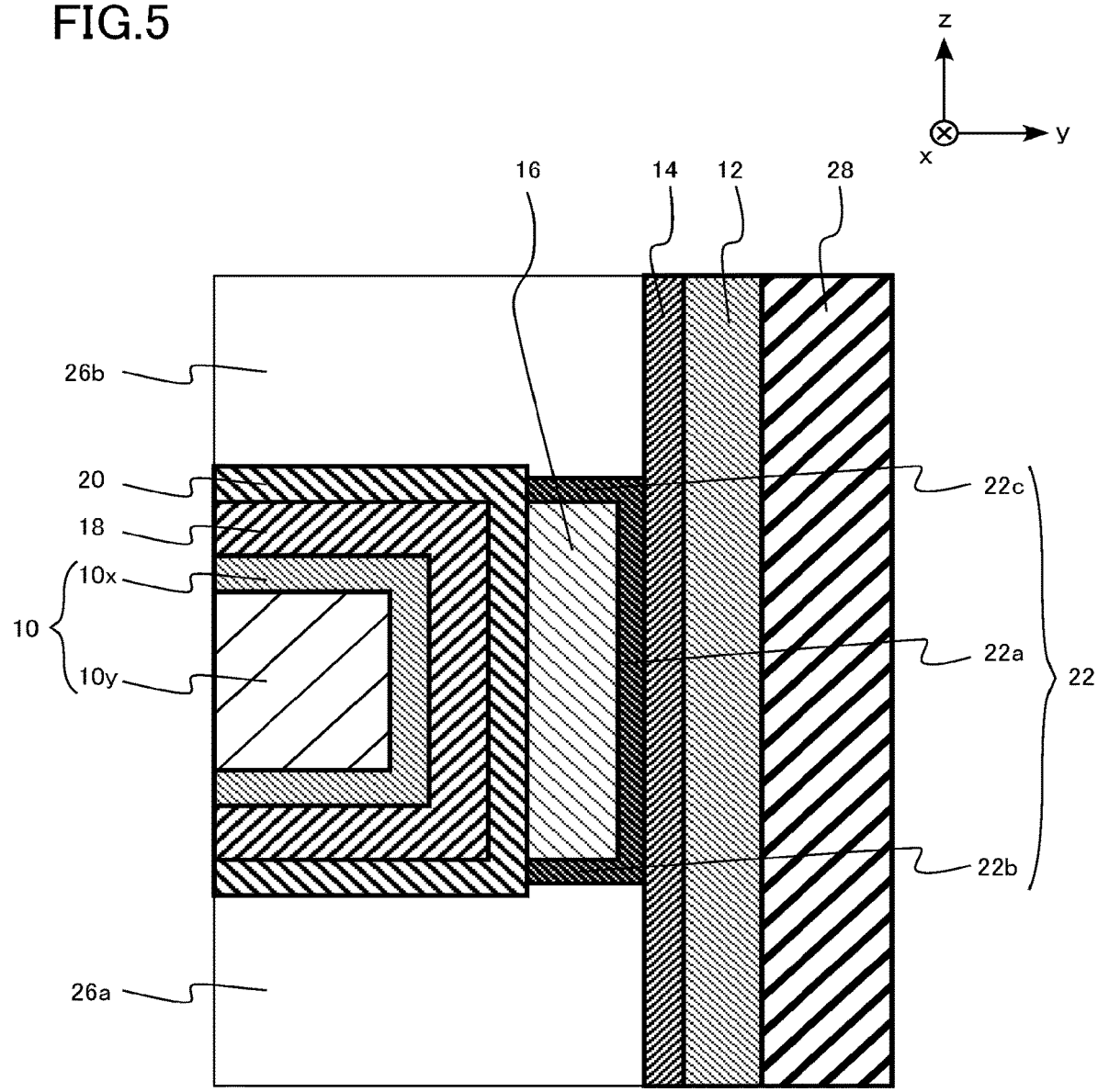
FIG. 5 is an enlarged schematic cross-sectional view of a part of the memory cell array of the semiconductor memory device of the embodiment.

FIG. 5 is an enlarged schematic cross-sectional view of a part of the memory cell array of the semiconductor memory device of the embodiment. FIG. 5 shows the yz cross section of the memory cell array 101. FIG. 5 shows a cross section of the memory cell MC1.

The memory cell array 101 has a gate electrode layer 10, a semiconductor layer 12, a tunnel insulating layer 14, a charge storage layer 16, a block insulating layer 18, a barrier insulating layer 20, a barrier region 22, a trench insulating layer 24, an interlayer insulating layer 26, and a core insulating layer 28.

The gate electrode layer 10 includes a first gate electrode layer 10a and a second gate electrode layer 10b. The barrier region 22 includes a first region 22a, a second region 22b, and a third region 22c. The interlayer insulating layer 26 includes a first interlayer insulating layer 26a and a second interlayer insulating layer 26b.

The tunnel insulating layer 14 is an example of the first insulating layer. The block insulating layer 18 is an example of the second insulating layer. The barrier insulating layer 20 is an example of the third insulating layer.

The gate electrode layer 10 extends in the x direction. A plurality of gate electrode layers 10 are disposed side by side in the y direction. The gate electrode layer 10 includes a barrier metal layer 10x and a metal layer 10y. The gate electrode layer 10 is provided between the interlayer insulating layer 26 and the interlayer insulating layer 26. The gate electrode layer 10 is provided, for example, between the first interlayer insulating layer 26a and the second interlayer insulating layer 26b.

The barrier metal layer 10x is, for example, a metal nitride or a metal carbide. The barrier metal layer 10x contains, for example, titanium nitride. The barrier metal layer 10x is, for example, titanium nitride.

The metal layer 10y is, for example, a metal. The metal layer 10y contains, for example, tungsten (W). The metal layer 10y is, for example, tungsten.

The first gate electrode layer 10a extends in the x direction. The first gate electrode layer 10a corresponds to, for example, the word line WLa shown in FIG. 2. The first gate electrode layer 10a functions as a gate electrode of the transistor of the memory cell MC1. The first gate electrode layer 10a includes a barrier metal layer 10ax and a metal layer 10ay.

The second gate electrode layer 10b extends in the x direction. The second gate electrode layer 10b is provided apart from the first gate electrode layer 10a in the y direction. The second gate electrode layer 10b is adjacent to the first gate electrode layer 10a in the y direction. The second gate electrode layer 10b corresponds to, for example, the word line WLb shown in FIG. 2. The second gate electrode layer 10b is electrically separated from the first gate electrode layer 10a. The second gate electrode layer 10b functions as a gate electrode of the transistor of the memory cell MC2. The second gate electrode layer 10b includes a barrier metal layer 10bx and a metal layer 10by.

The semiconductor layer 12 extends in the z direction. The semiconductor layer 12 is provided in the y direction of the gate electrode layer 10. The semiconductor layer 12 is provided, for example, between the first gate electrode layer 10a and the second gate electrode layer 10b. The semiconductor layer 12 has, for example, a cylindrical shape.

The semiconductor layer 12 functions as a channel of the transistor of the memory cell MC.

The semiconductor layer 12 is, for example, a polycrystalline semiconductor. The semiconductor layer 12 contains, for example, polycrystalline silicon. The semiconductor layer 12 is, for example, polycrystalline silicon. The thickness of the semiconductor layer 12 in the xy plane is, for example, equal to or more than 5 nm and equal to or less than 30 nm. The thickness of the semiconductor layer 12 in the y direction is, for example, equal to or more than 5 nm and equal to or less than 30 nm.

The tunnel insulating layer 14 is provided between the gate electrode layer 10 and the semiconductor layer 12. The tunnel insulating layer 14 surrounds, for example, the semiconductor layer 12. The tunnel insulating layer 14 is provided between the charge storage layer 16 and the semiconductor layer 12. The tunnel insulating layer 14 is provided between the first region 22a of the barrier region 22 and the semiconductor layer 12.

The tunnel insulating layer 14 functions as a charge transfer path between the semiconductor layer 12 and the charge storage layer 16 when data is written to or erased from the memory cell MC. The tunnel insulating layer 14 has a function of blocking transfer of charges between the semiconductor layer 12 and the charge storage layer 16 in a case where the memory cell MC is in the charge retention state.

The tunnel insulating layer 14 is an insulator. The tunnel insulating layer 14 contains, for example, an oxide, a nitride, or an oxynitride. The tunnel insulating layer 14 is, for example, an oxide, a nitride, or an oxynitride.

The tunnel insulating layer 14 contains, for example, silicon (Si) and oxygen (O). The tunnel insulating layer 14 contains, for example, silicon oxide. The tunnel insulating layer 14 is, for example, silicon oxide.

The tunnel insulating layer 14 contains, for example, nitrogen (N).

The thickness of the tunnel insulating layer 14 in the y direction is, for example, equal to or more than 1 nm and equal to or less than 10 nm.

The charge storage layer 16 is provided between the gate electrode layer 10 and the tunnel insulating layer 14. The charge storage layer 16 is provided between the block insulating layer 18 and the tunnel insulating layer 14. The charge storage layer 16 is provided between the block insulating layer 18 and the first region 22a of the barrier region 22. The charge storage layer 16 is provided between the barrier insulating layer 20 and the first region 22a of the barrier region 22.

The charge storage layer 16 has a function of storing charges. Data is stored in the memory cell MC based on the charges stored in the charge storage layer 16.

The charge storage layer 16 is a layer containing a metal element. The charge storage layer 16 contains at least one metal element selected from the group consisting of titanium (Ti), tantalum (Ta), and aluminum (Al). For example, the atomic concentration of at least one metal element is the highest among the atomic concentrations of the metal elements contained in the charge storage layer 16.

The charge storage layer 16 is, for example, a conductor. The charge storage layer 16 contains, for example, a metal, a metal nitride or a metal carbide. The charge storage layer 16 is, for example, a metal, a metal nitride, or a metal carbide.

The charge storage layer 16 contains, for example, nitrogen (N).

The charge storage layer 16 contains, for example, titanium nitride. The charge storage layer 16 contains, for example, titanium nitride as a main component. The fact that the charge storage layer 16 contains titanium nitride as a main component means that the molar ratio of titanium nitride is the highest among the substances contained in the charge storage layer 16. The charge storage layer 16 is, for example, titanium nitride.

The charge storage layer 16 contains, for example, tantalum nitride. The charge storage layer 16 contains, for example, tantalum nitride as a main component. The charge storage layer 16 is, for example, tantalum nitride.

The charge storage layer 16 contains, for example, aluminum nitride. The charge storage layer 16 contains, for example, aluminum nitride as a main component. The charge storage layer 16 is, for example, aluminum nitride.

The charge storage layer 16 contains, for example, manganese (Mn).

The thickness of the charge storage layer 16 in the y direction is larger than the thickness of the tunnel insulating layer 14 in the y direction, for example. The thickness of the charge storage layer 16 in the y direction is, for example, equal to or more than 2 nm and equal to or less than 20 nm.

The block insulating layer 18 is provided between the gate electrode layer 10 and the charge storage layer 16. The block insulating layer 18 is provided between the gate electrode layer 10 and the barrier insulating layer 20.

The block insulating layer 18 has a function of blocking transfer of charges between the gate electrode layer 10 and the charge storage layer 16.

The block insulating layer 18 is an insulator. The block insulating layer 18 contains, for example, an oxide, a nitride, or an oxynitride. The block insulating layer 18 is, for example, an oxide, a nitride, or an oxynitride.

The block insulating layer 18 contains, for example, aluminum (Al) and oxygen (O). The block insulating layer 18 contains, for example, aluminum oxide.

The block insulating layer 18 contains, for example, silicon (Si) and oxygen (O). The block insulating layer 18 contains, for example, silicon oxide.

The block insulating layer 18 has, for example, a stacked structure. The block insulating layer 18 has a stacked structure of, for example, a silicon oxide layer and an aluminum oxide layer provided on the gate electrode layer 10 side of the silicon oxide layer.

The thickness of the block insulating layer 18 in the y direction is larger than the thickness of the tunnel insulating layer 14 in the y direction, for example. The thickness of the block insulating layer 18 in the y direction is, for example, equal to or more than 5 nm and equal to or less than 20 nm.

The barrier insulating layer 20 is provided between the block insulating layer 18 and the charge storage layer 16. The barrier insulating layer 20 has a function of preventing the metal element contained in the charge storage layer 16 from diffusing.

The barrier insulating layer 20 contains silicon (Si) and nitrogen (N). The barrier insulating layer 20 contains, for example, silicon nitride. The barrier insulating layer 20 is silicon nitride.

The material of the barrier insulating layer 20 is different from the material of the block insulating layer 18.

The thickness of the barrier insulating layer 20 in the y direction is thinner than the thickness of the block insulating layer 18 in the y direction, for example. The thickness of the barrier insulating layer 20 in the y direction is, for example, equal to or more than 0.5 nm and equal to or less than 3 nm.

The barrier region 22 is provided between the charge storage layer 16 and the tunnel insulating layer 14. The barrier region 22 includes a first region 22a, a second region 22b, and a third region 22c. The barrier region 22 has a function of preventing the metal element contained in the charge storage layer 16 from diffusing.

The first region 22a is provided between the charge storage layer 16 and the tunnel insulating layer 14. The first region 22a contains manganese (Mn), silicon (Si), and oxygen (O). The first region 22a contains, for example, manganese silicate. The first region 22a contains, for example, manganese silicate as a main component. The first region 22a is, for example, manganese silicate. The thickness of the first region 22a in the y direction is, for example, equal to or more than 0.5 nm and equal to or less than 3 nm.

The second region 22b is provided between the charge storage layer 16 and the first interlayer insulating layer 26a. The second region 22b is in contact with the barrier insulating layer 20, for example.

The second region 22b contains manganese (Mn), silicon (Si), and oxygen (O). The second region 22b contains, for example, manganese silicate. The second region 22b contains, for example, manganese silicate as a main component. The second region 22b is, for example, manganese silicate. The thickness of the second region 22b in the z direction is, for example, equal to or more than 0.5 nm and equal to or less than 3 nm.

The third region 22c is provided between the charge storage layer 16 and the second interlayer insulating layer 26b. The third region 22c is in contact with the barrier insulating layer 20, for example.

The third region 22c contains manganese (Mn), silicon (Si), and oxygen (O). The third region 22c contains, for example, manganese silicate. The third region 22c contains, for example, manganese silicate as a main component. The third region 22c is, for example, manganese silicate. The thickness of the third region 22c in the z direction is, for example, equal to or more than 0.5 nm and equal to or less than 3 nm.

The trench insulating layer 24 contains, for example, silicon (Si) and oxygen (O). The trench insulating layer 24 contains, for example, silicon oxide. The trench insulating layer 24 is, for example, silicon oxide.

The trench insulating layer 24 is provided between the adjacent gate electrode layers 10 in the y direction. The trench insulating layer 24 is provided between the first gate electrode layer 10a and the second gate electrode layer 10b, for example.

The trench insulating layer 24 is, for example, an oxide, an oxynitride, or a nitride. The trench insulating layer 24 contains, for example, silicon oxide or aluminum oxide. The trench insulating layer 24 is, for example, silicon oxide or aluminum oxide.

The interlayer insulating layer 26 is arranged in the z direction. For example, the first interlayer insulating layer 26a and the second interlayer insulating layer 26b are arranged in the z direction. The interlayer insulating layer 26 is provided between the gate electrode layers 10 adjacent in the z direction. The gate electrode layer 10 is sandwiched between the two interlayer insulating layers 26 in the z direction. For example, as shown in FIG. 5, the gate electrode layer 10 is provided in the z direction of the first interlayer insulating layer 26a. The second interlayer insulating layer 26b is provided in the z direction of the gate electrode layer 10.

The interlayer insulating layer 26 is, for example, an oxide, an oxynitride, or a nitride. The interlayer insulating layer 26 contains, for example, silicon (Si) and oxygen (O). The interlayer insulating layer 26 contains, for example, silicon oxide. The interlayer insulating layer 26 is, for example, silicon oxide. The first interlayer insulating layer 26a and the second interlayer insulating layer 26b contain, for example, silicon (Si) and oxygen (O). The first interlayer insulating layer 26a and the second interlayer insulating layer 26b contain, for example, silicon oxide. The first interlayer insulating layer 26a and the second interlayer insulating layer 26b are, for example, silicon oxide. The thickness of the interlayer insulating layer 26 in the z direction is, for example, equal to or more than 5 nm and equal to or less than 30 nm.

The core insulating layer 28 is surrounded by the semiconductor layer 12. The core insulating layer 28 extends in the z direction. The core insulating layer 28 has, for example, a cylindrical shape.

The core insulating layer 28 is, for example, an oxide, an oxynitride, or a nitride. The core insulating layer 28 contains, for example, silicon oxide. The core insulating layer 28 is, for example, silicon oxide.

Next, an example of the method of manufacturing the semiconductor memory device according to the embodiment will be described.

A method of manufacturing a semiconductor memory device of the embodiment includes: alternately and repeatedly forming a first insulating film and a second insulating film; forming a first opening penetrating the first insulating film and the second insulating film; selectively removing a portion of the second insulating film exposed on an inner surface of the first opening with respect to the first insulating film; forming a first film containing a metal element in a region from which the portion of the second insulating film has been removed; forming a third insulating film on the first film; forming a semiconductor film on the third insulating film in the first opening; forming a second opening penetrating the first insulating film and the second insulating film; selectively removing the second insulating film with respect to the first insulating film via the second opening to expose the first film; forming a first metal film containing copper (Cu) and manganese (Mn), in a region from which the second insulating film has been removed, so as to come into contact with the first film; performing a first heat treatment after forming the first metal film to form a region containing manganese (Mn) between the first film and the third insulating film; removing the first metal film; forming a fourth insulating film in a region where the first metal film has been removed; and forming a second metal film on the fourth insulating film in a region where the first metal film has been removed.

FIGS. 6 to 25 are schematic cross-sectional views showing the method of manufacturing the semiconductor memory device according to the embodiment. FIGS. 6 to 25 are views showing an example of the method of manufacturing the memory cell array 101 of the three-dimensional NAND flash memory 100.

FIGS. 6 to 25 show yz cross sections of the memory cell array 101.

Figure 6:
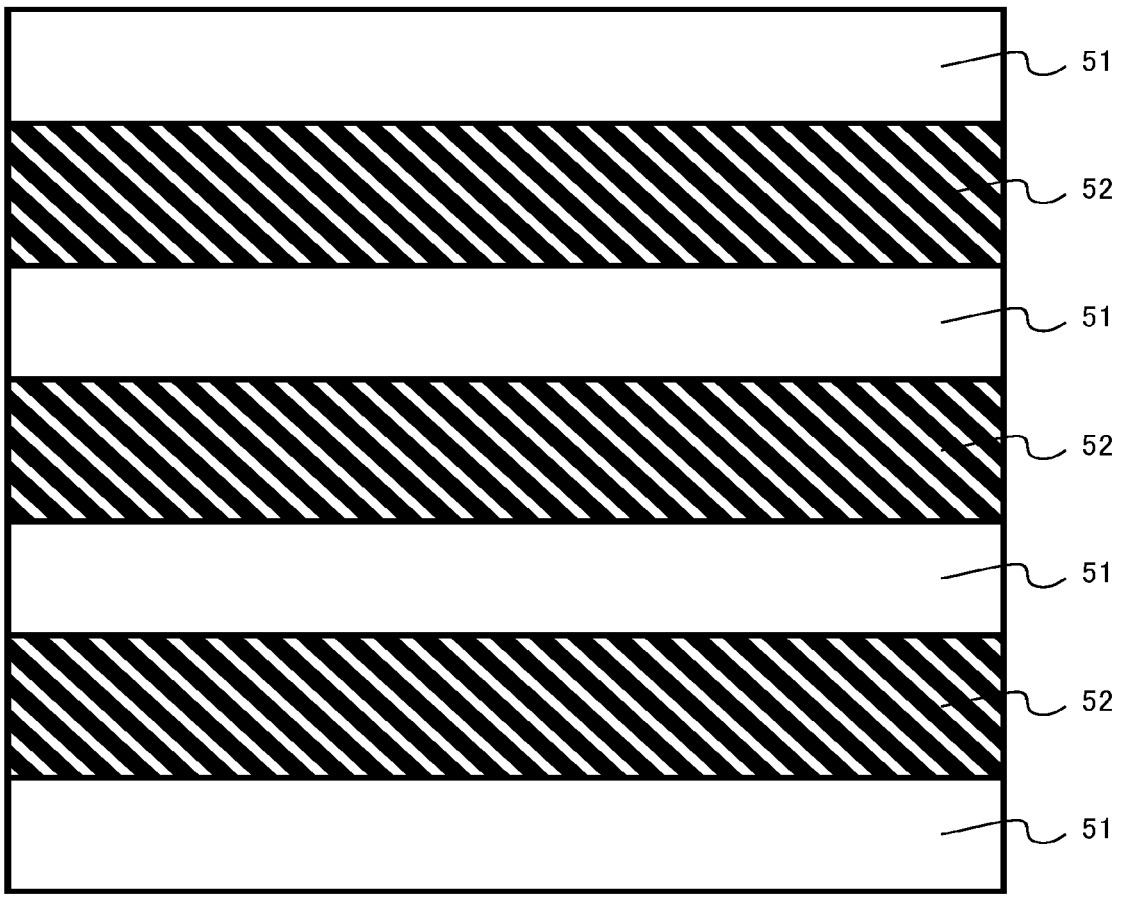
FIG. 6 is a schematic cross-sectional view showing a method of manufacturing the semiconductor memory device according to the embodiment.

First, a first silicon oxide film 51 and a first silicon nitride film 52 are alternately and repeatedly stacked on a semiconductor substrate (not illustrated) (FIG. 6). The first silicon oxide film 51 is an example of the first insulating film. The first silicon nitride film 52 is an example of the second insulating film.

The first silicon oxide film 51 and the first silicon nitride film 52 are formed by, for example, the chemical vapor deposition method (CVD method). A part of the first silicon oxide film 51 eventually becomes the interlayer insulating layer 26.

Figure 7:
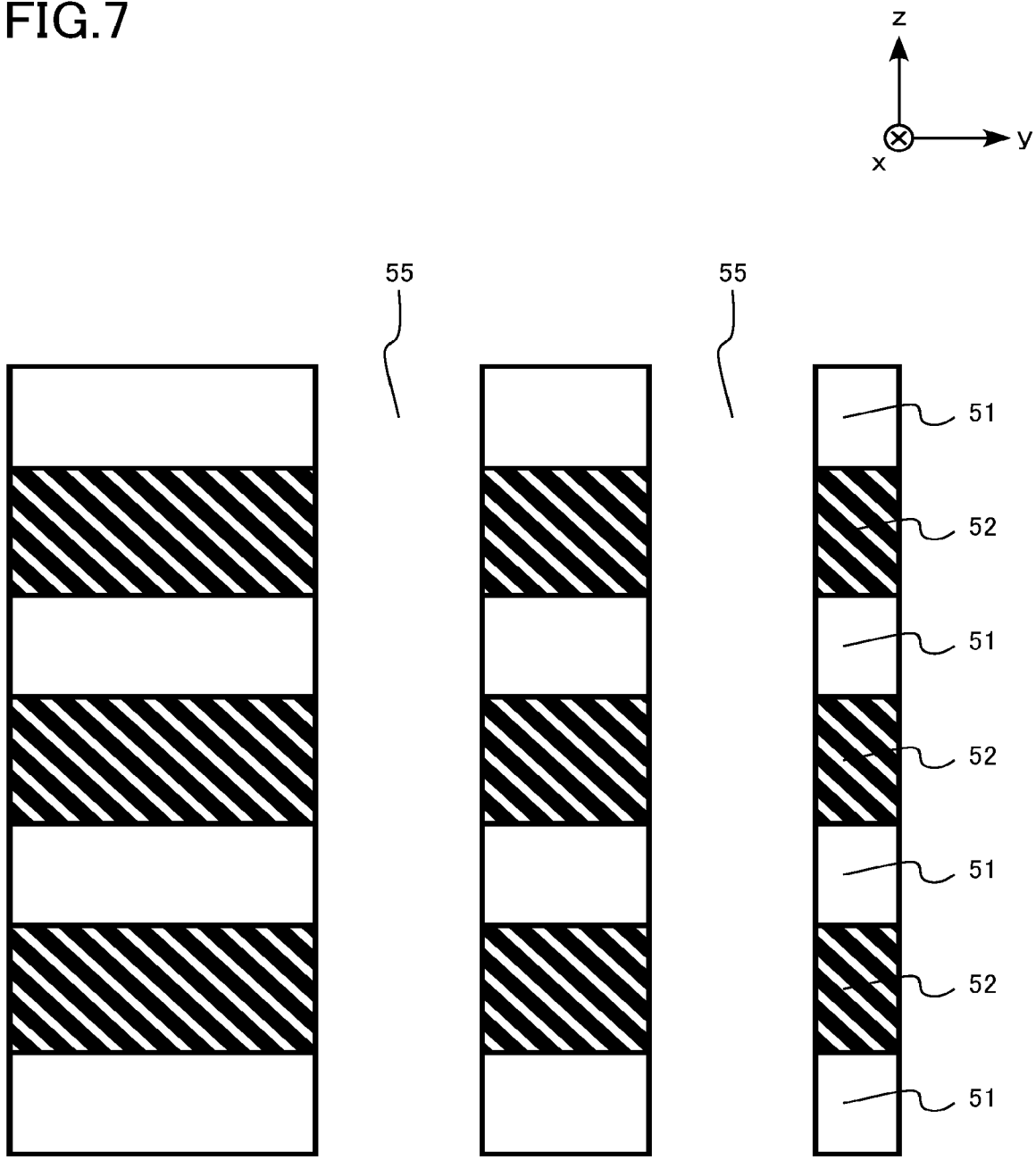
FIG. 7 is a schematic cross-sectional view showing a method of manufacturing the semiconductor memory device according to the embodiment.

Next, a memory trench 55 is formed in the first silicon oxide film 51 and the first silicon nitride film 52 (FIG. 7). The memory trench 55 penetrates the first silicon oxide film 51 and the first silicon nitride film 52.

The memory trench 55 is formed by, for example, the lithography method and the reactive ion etching method (RIE method).

Figure 8:
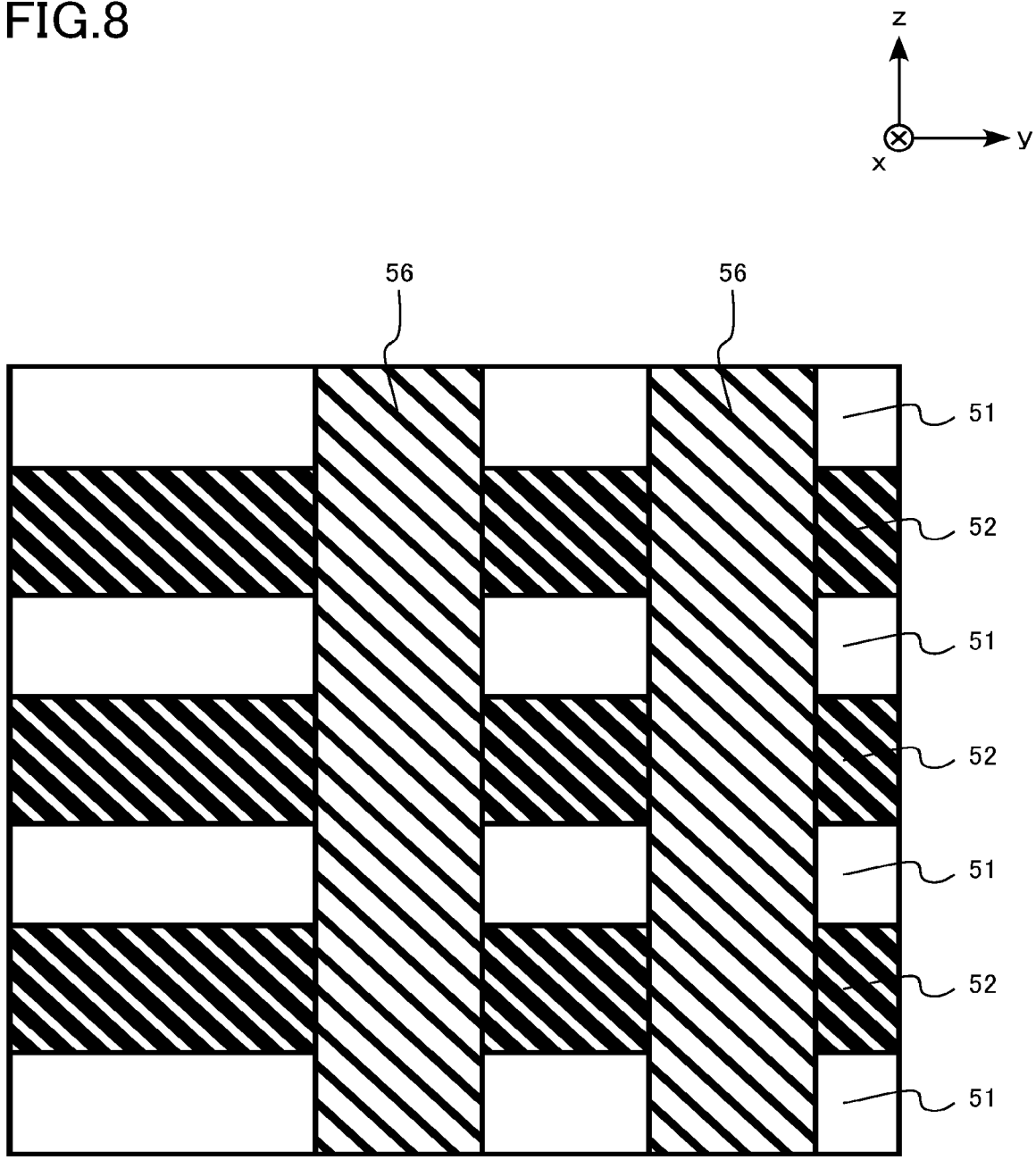
FIG. 8 is a schematic cross-sectional view showing a method of manufacturing the semiconductor memory device according to the embodiment.

Next, the inside of the memory trench 55 is filled with a second silicon oxide film 56 (FIG. 8). The second silicon oxide film 56 is formed by, for example, the CVD method. The second silicon oxide film 56 eventually becomes the trench insulating layer 24.

Figure 9:
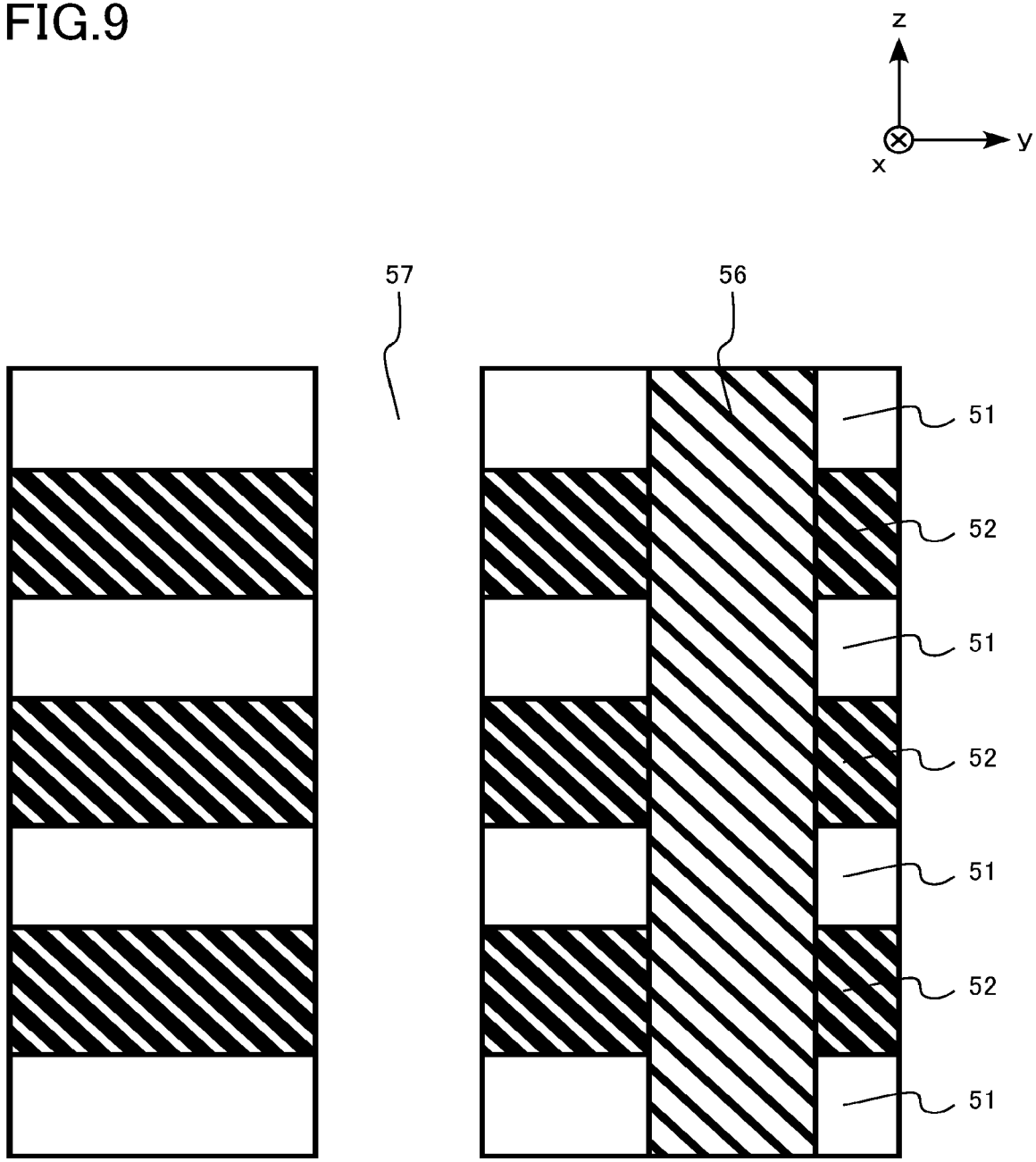
FIG. 9 is a schematic cross-sectional view showing a method of manufacturing the semiconductor memory device according to the embodiment.

Next, a memory hole 57 penetrating the second silicon oxide film 56, the first silicon oxide film 51, and the first silicon nitride film 52 is formed (FIG. 9). The memory hole 57 is an example of the first opening. The memory hole 57 is formed by, for example, the lithography method and the RIE method.

Figure 10:
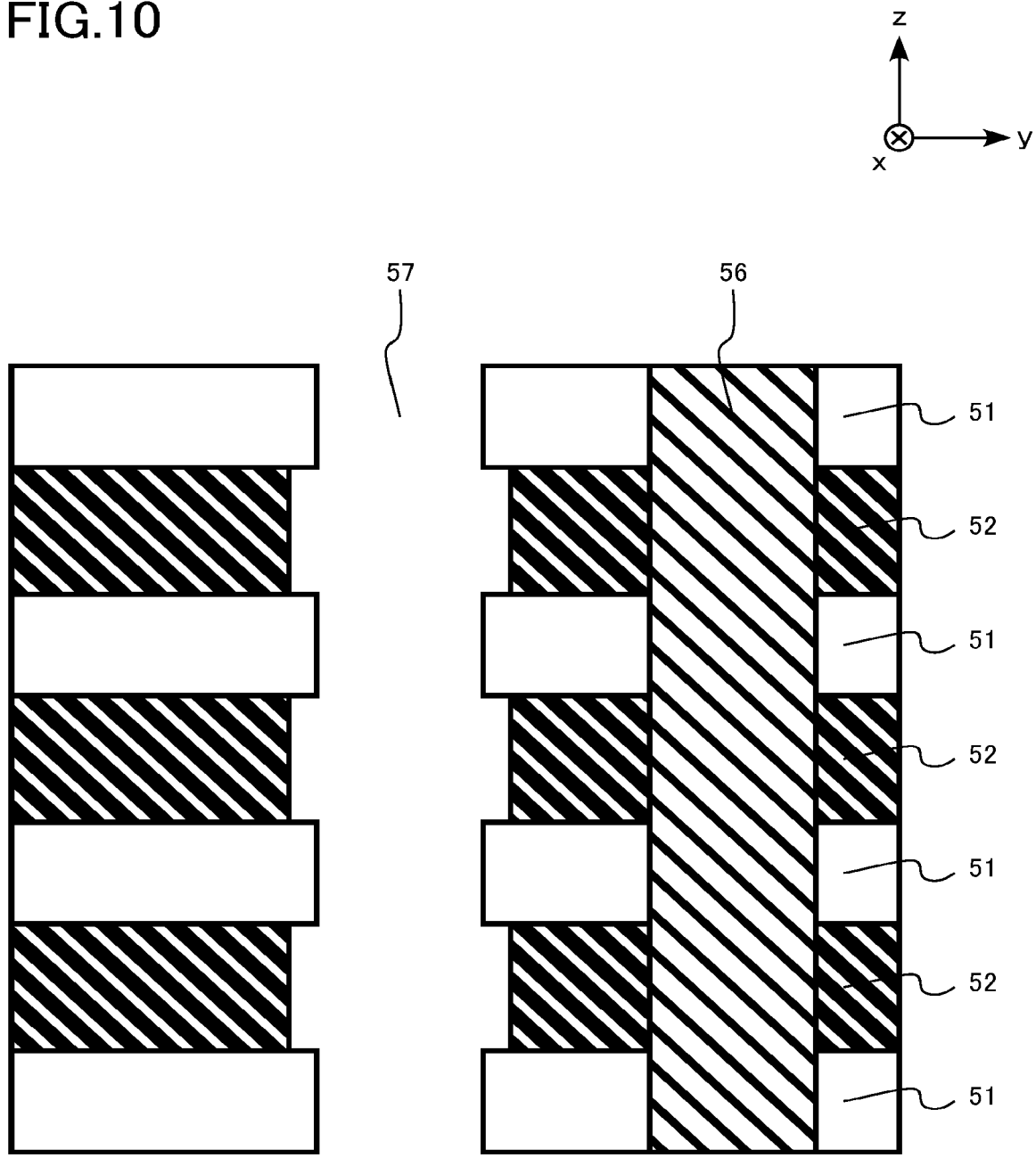
FIG. 10 is a schematic cross-sectional view showing a method of manufacturing the semiconductor memory device according to the embodiment.

Next, a portion of the first silicon nitride film 52 exposed on the inner surface of the memory hole 57 is selectively removed with respect to the first silicon oxide film 51 (FIG. 10). The first silicon nitride film 52 is retracted in the y direction. The first silicon nitride film 52 is removed, for example, by the wet etching method. The first silicon nitride film 52 is etched using, for example, a phosphoric acid solution. Then, the surface of the first silicon nitride film 52 is oxidized to form an oxide layer not illustrated.

Figure 11:
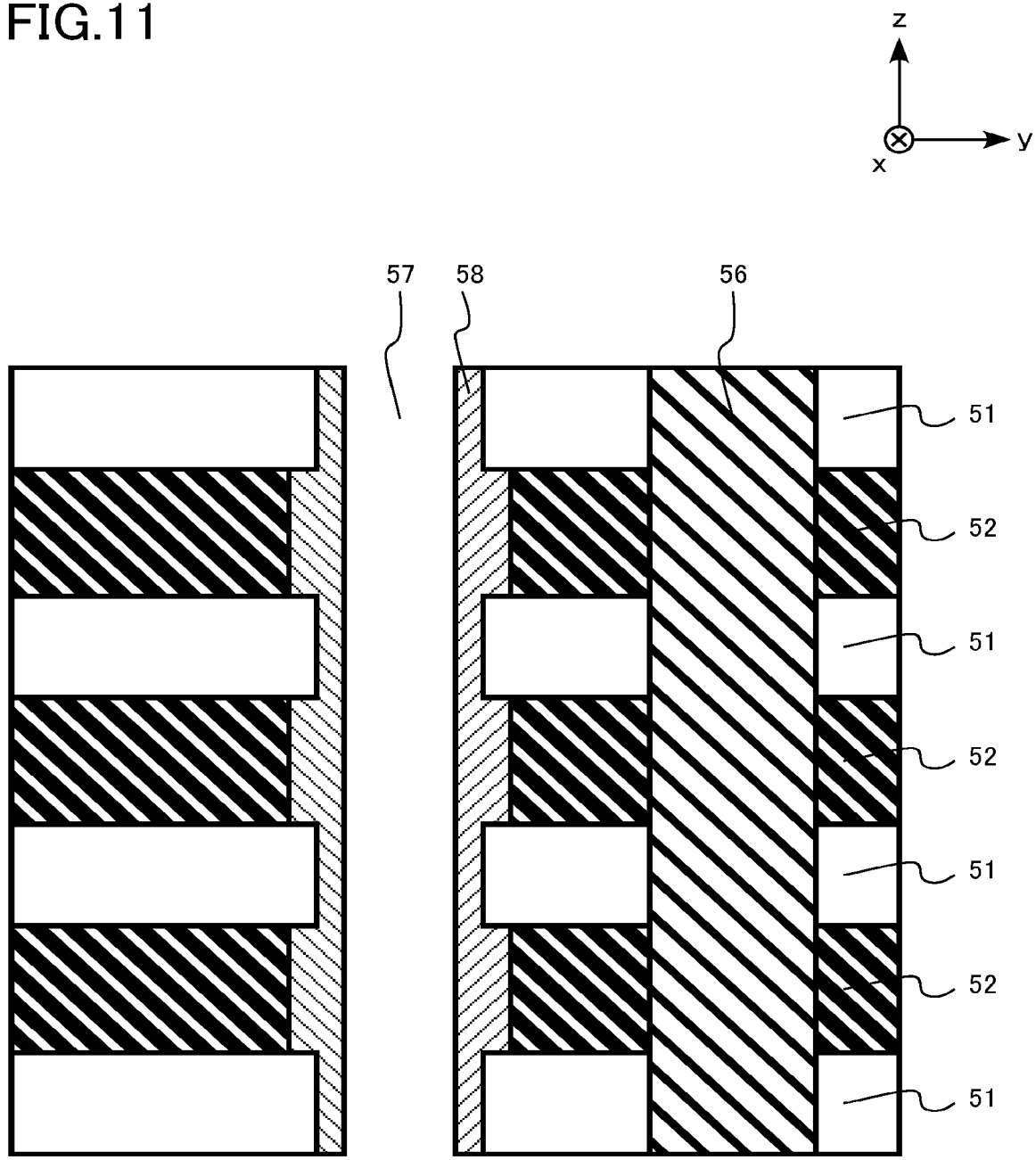
FIG. 11 is a schematic cross-sectional view showing a method of manufacturing the semiconductor memory device according to the embodiment.

Next, a first titanium nitride film 58 is formed in the memory hole 57 (FIG. 11). The first titanium nitride film 58 is an example of the first film. The first titanium nitride film 58 is formed by, for example, by the CVD method.

Figure 12:
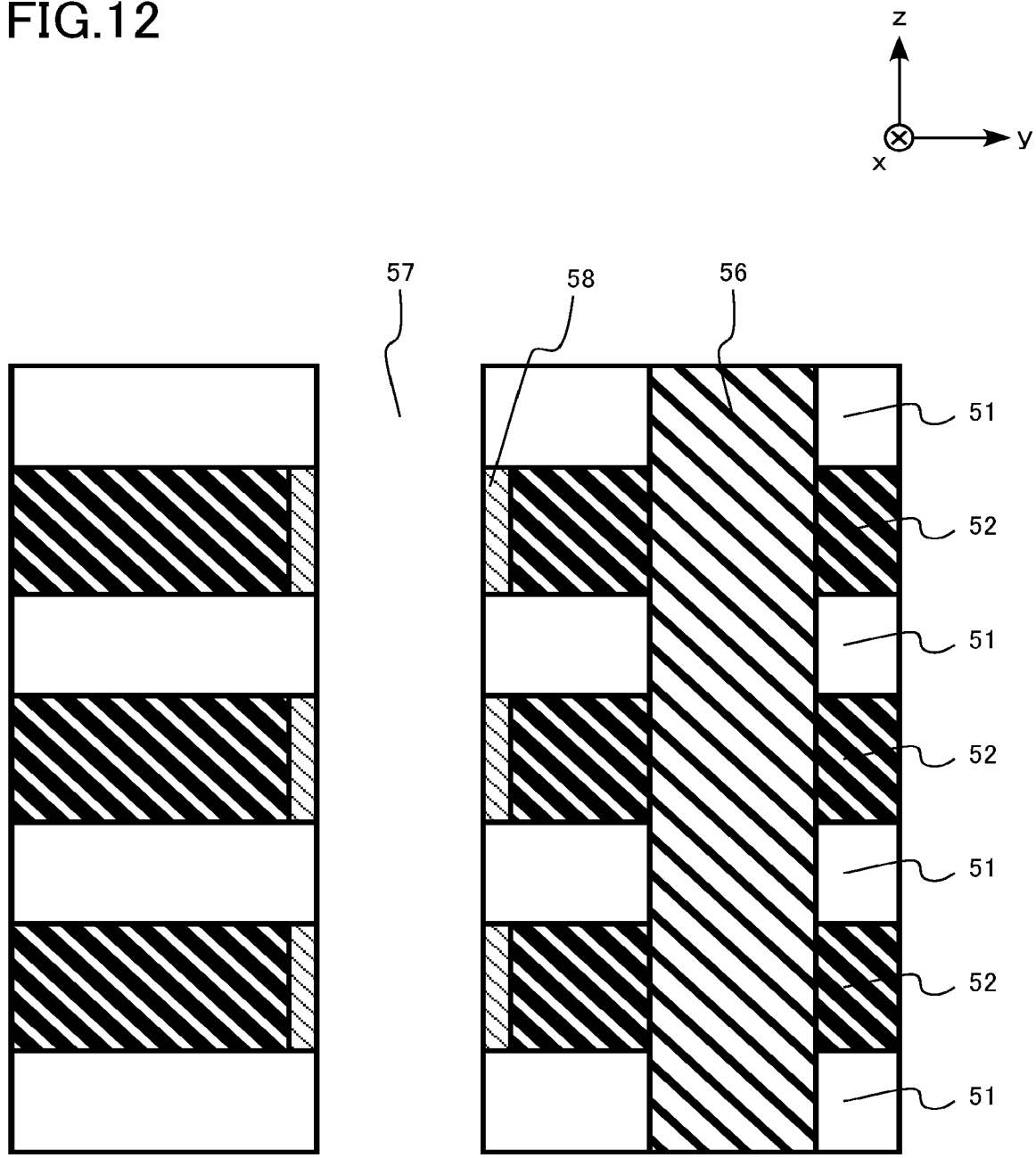
FIG. 12 is a schematic cross-sectional view showing a method of manufacturing the semiconductor memory device according to the embodiment.

Next, the first titanium nitride film 58 on the first silicon oxide film 51 on the inner surface of the memory hole 57 is removed (FIG. 12). The first titanium nitride film 58 is removed by, for example, the RIE method.

The first titanium nitride film 58 remains in a recess from which the first silicon nitride film 52 has been removed. The first titanium nitride film 58 is formed in a region from which the first silicon nitride film 52 has been removed. The first titanium nitride film 58 eventually becomes the charge storage layer 16.

Next, a third silicon oxide film 59 is formed on the first titanium nitride film 58 in the memory hole 57. The third silicon oxide film 59 is an example of the third insulating film. The third silicon oxide film 59 is formed by, for example, the CVD method. The third silicon oxide film 59 eventually becomes the tunnel insulating layer 14.

Figure 13:
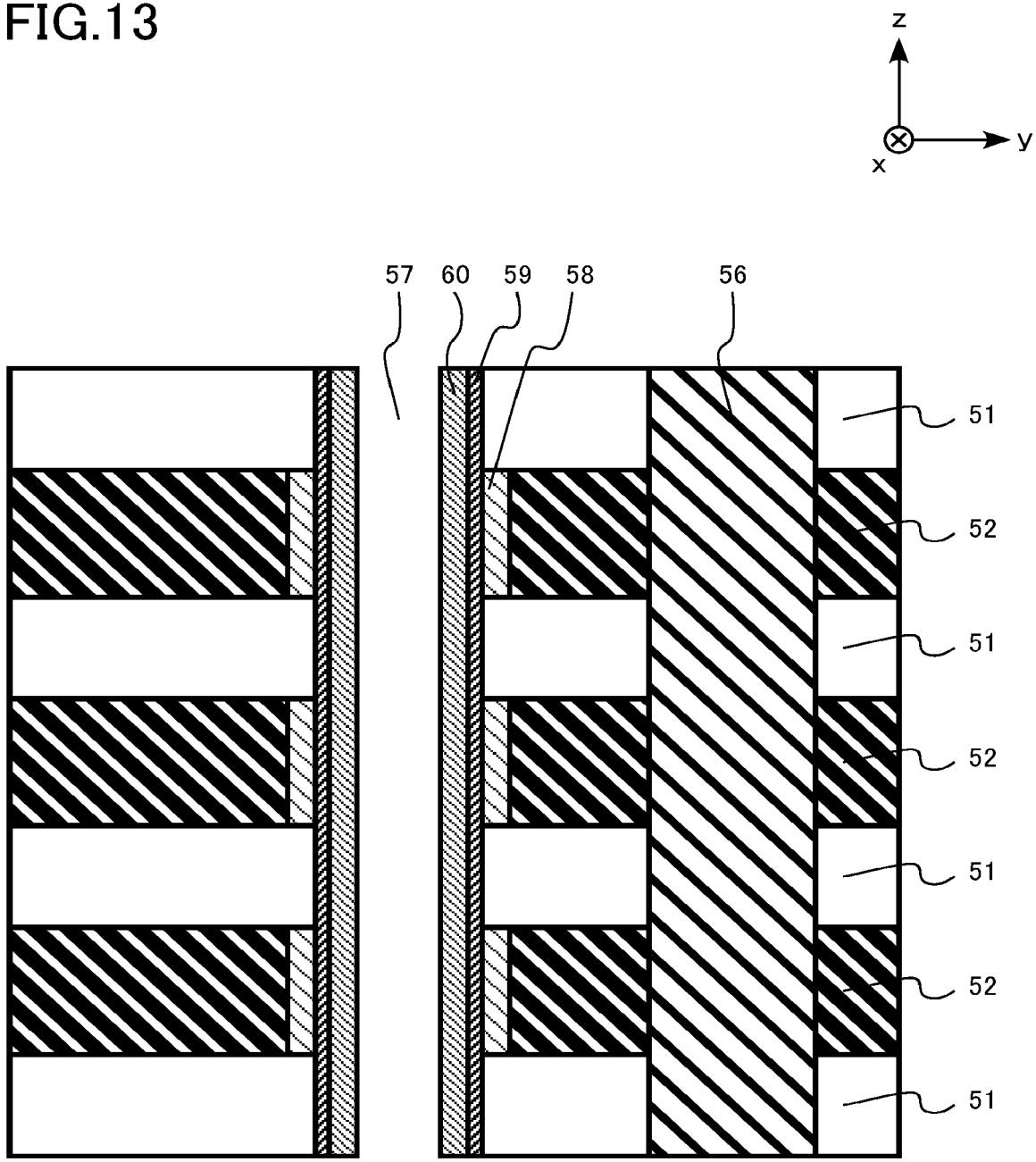
FIG. 13 is a schematic cross-sectional view showing a method of manufacturing the semiconductor memory device according to the embodiment.

Next, a polycrystalline silicon film 60 is formed on the third silicon oxide film 59 on the inner surface of the memory hole 57 (FIG. 13). The polycrystalline silicon film 60 is an example of a semiconductor film. The polycrystalline silicon film 60 is formed by, for example, the CVD method. The polycrystalline silicon film 60 eventually becomes the semiconductor layer 12.

Figure 14:
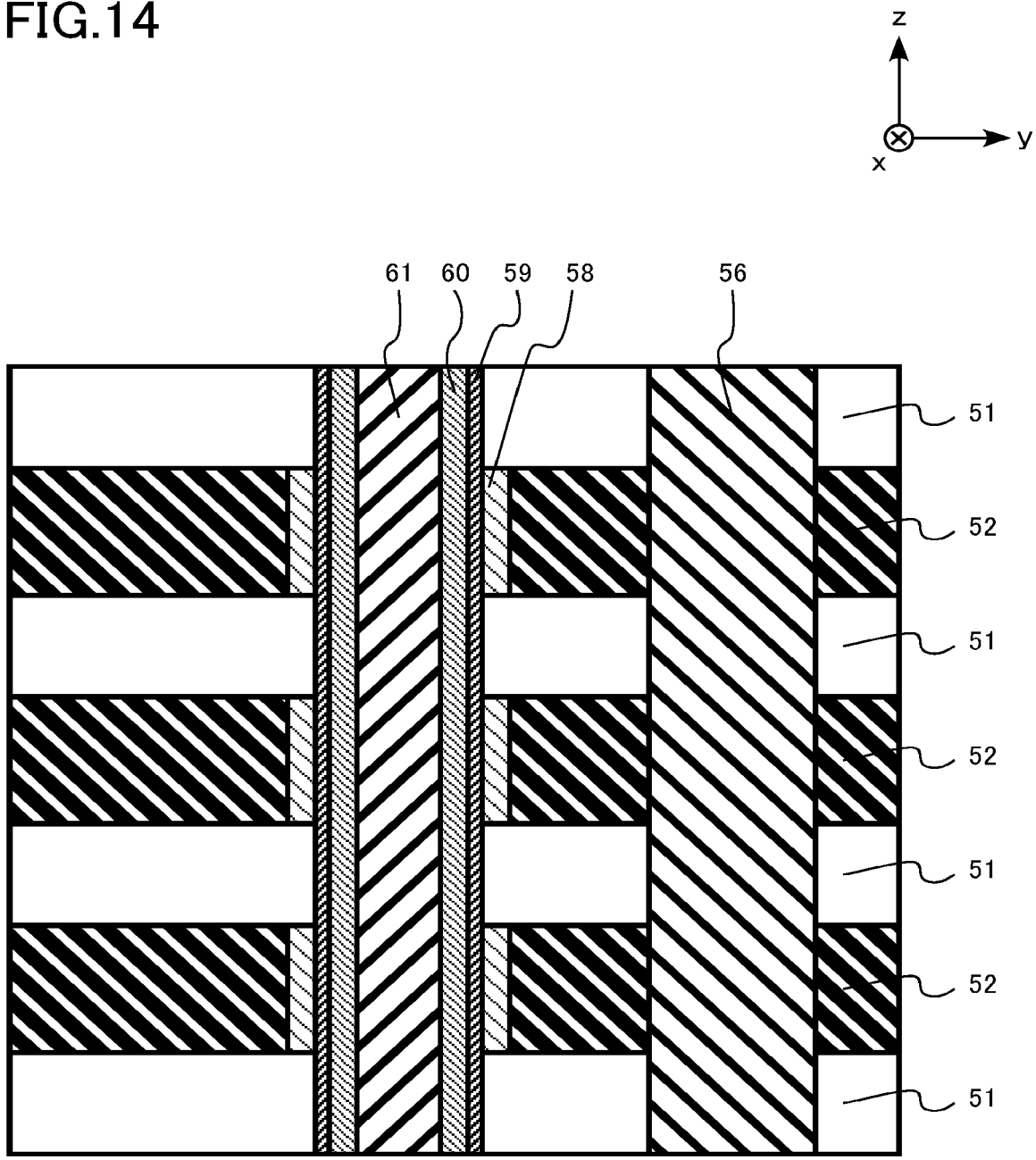
FIG. 14 is a schematic cross-sectional view showing a method of manufacturing the semiconductor memory device according to the embodiment.

Next, the inside of the memory hole 57 is filled with a fourth silicon oxide film 61 (FIG. 14). The fourth silicon oxide film 61 is formed by, for example, the CVD method. The fourth silicon oxide film 61 eventually becomes the core insulating layer 28.

Figure 15:
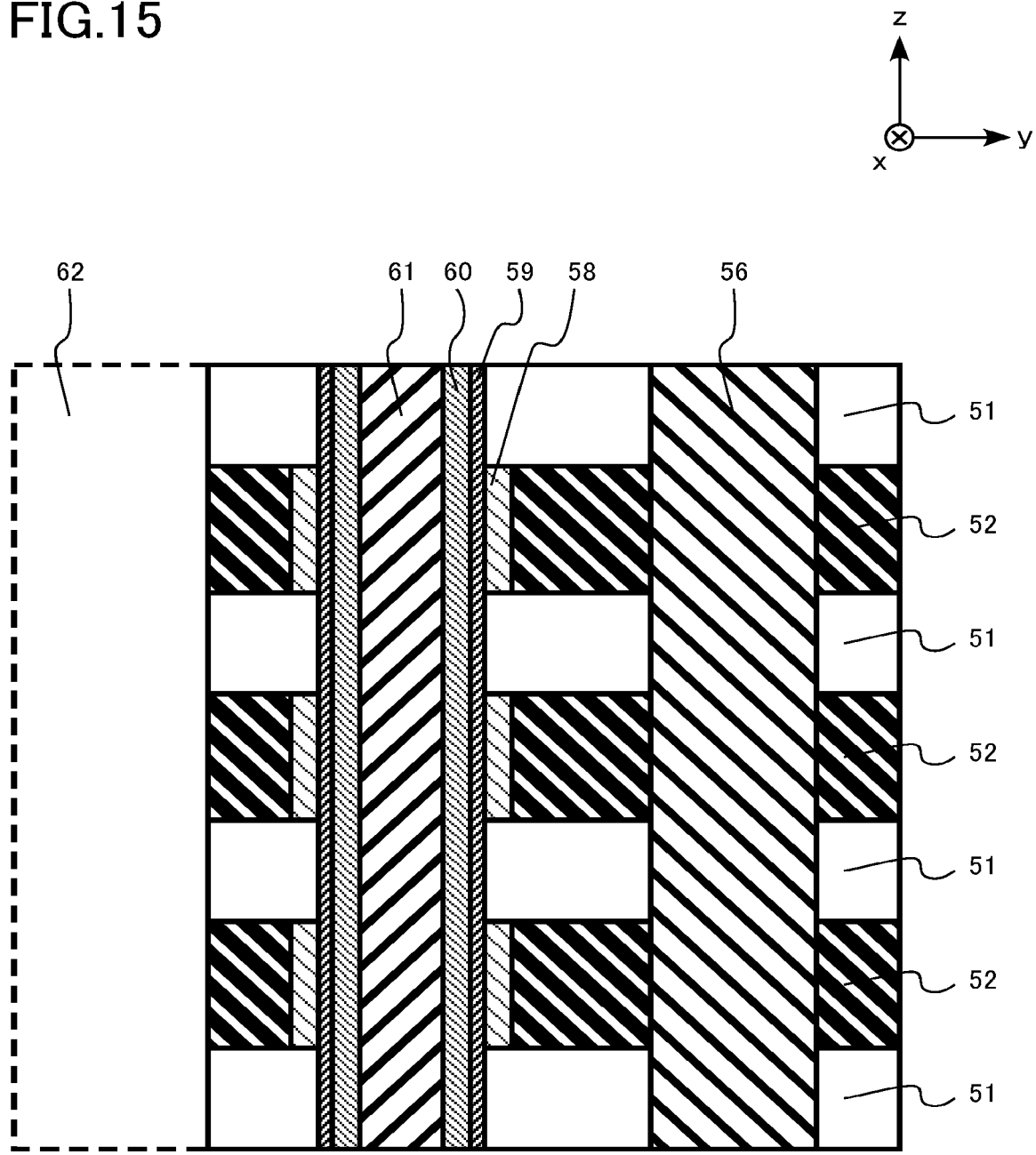
FIG. 15 is a schematic cross-sectional view showing a method of manufacturing the semiconductor memory device according to the embodiment.

Next, a slit trench 62 is formed in the first silicon oxide film 51 and the first silicon nitride film 52 (FIG. 15). The slit trench 62 is an example of the second opening. The slit trench 62 penetrates the first silicon oxide film 51 and the first silicon nitride film 52. The slit trench 62 is provided at the end of the memory cell array 101.

Figure 16:
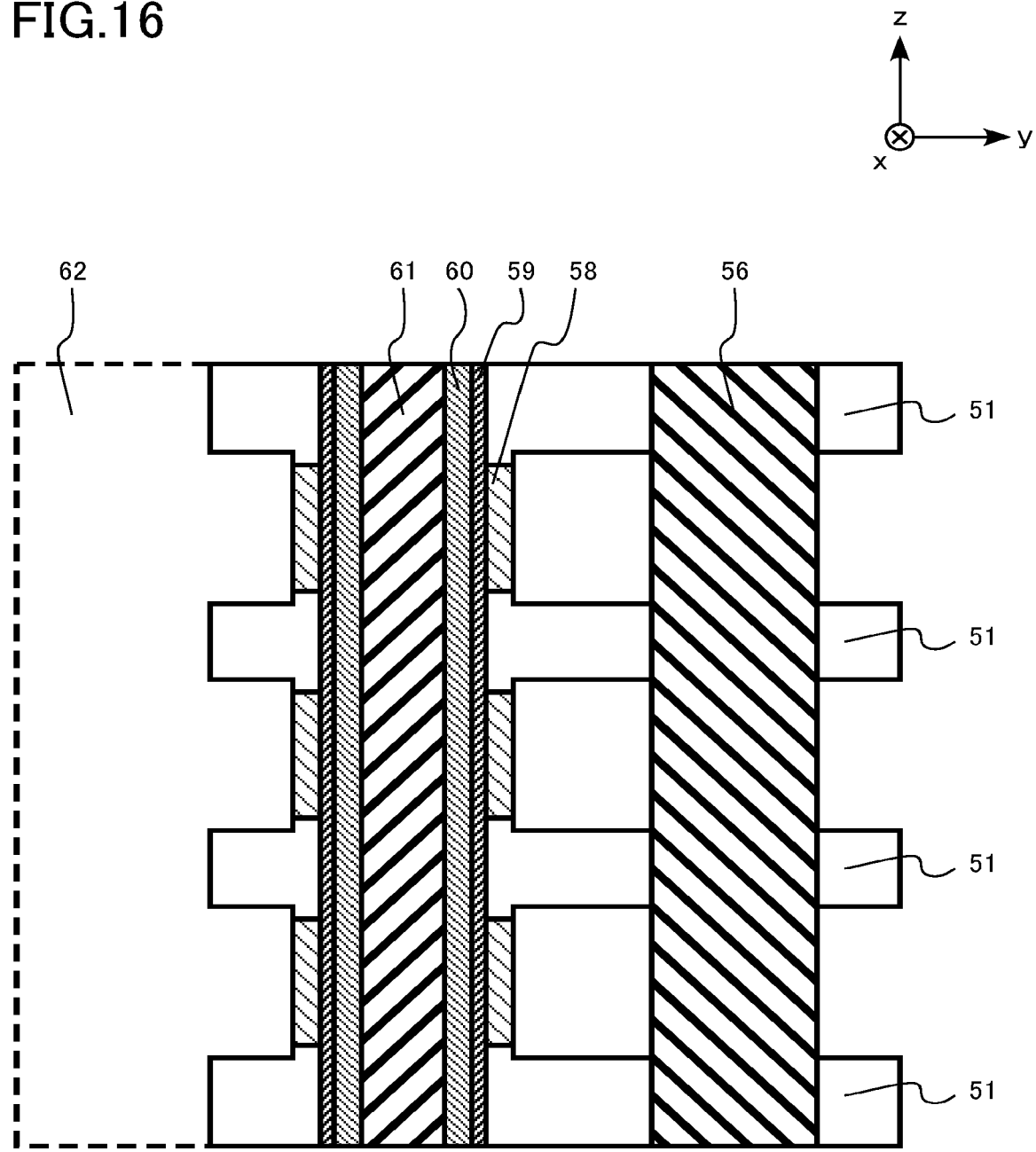
FIG. 16 is a schematic cross-sectional view showing a method of manufacturing the semiconductor memory device according to the embodiment.

Next, the first silicon nitride film 52 is selectively removed from the first silicon oxide film 51 via the slit trench 62. The first silicon nitride film 52 is removed, for example, by the wet etching method. The first silicon nitride film 52 is etched using, for example, a phosphoric acid solution. Then, the oxide layer not illustrated is removed by the wet etching method to expose the first titanium nitride film 58 (FIG. 16).

Figure 17:
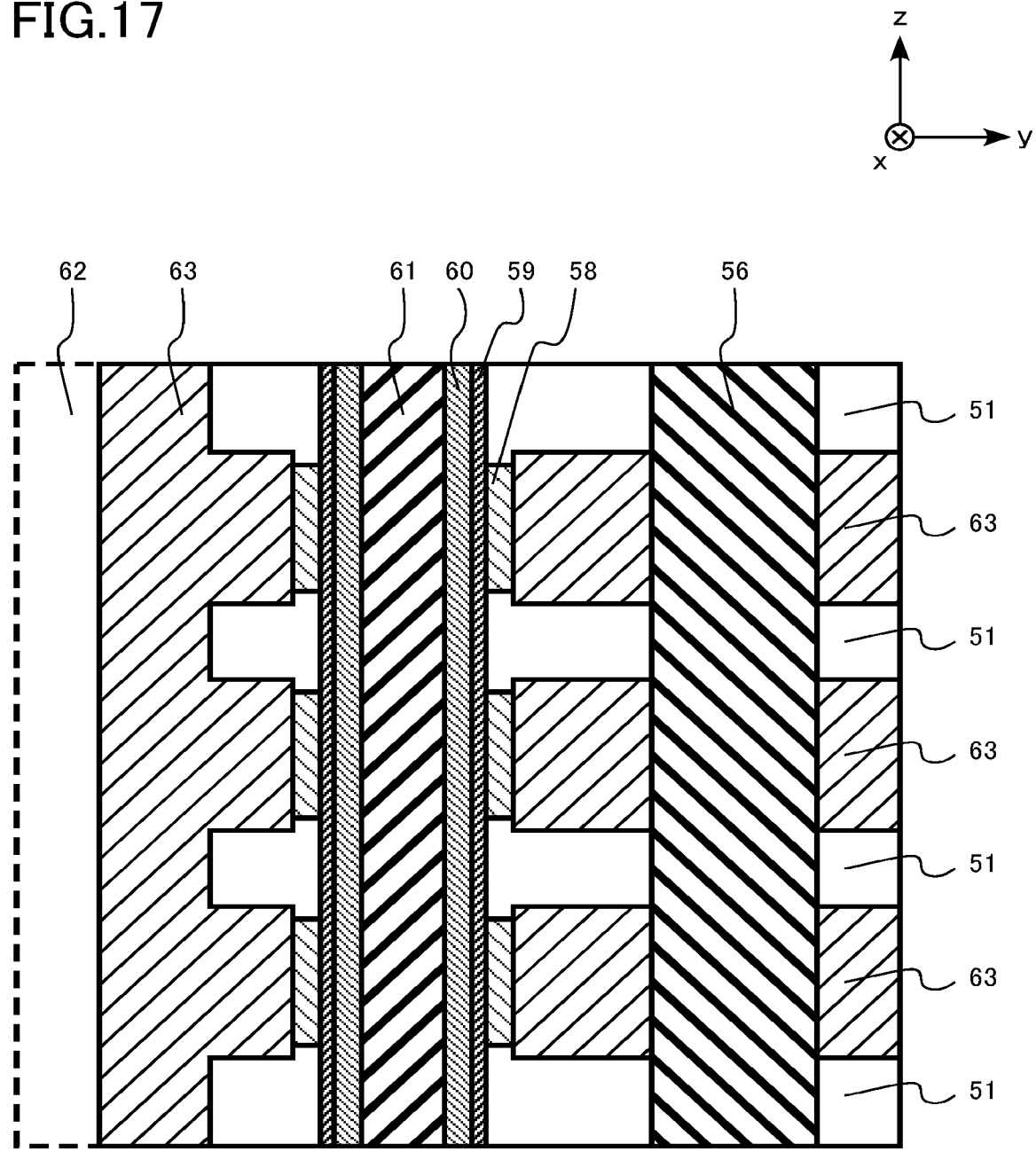
FIG. 17 is a schematic cross-sectional view showing a method of manufacturing the semiconductor memory device according to the embodiment.

Next, a copper film 63 containing manganese is formed so as to come into contact with the first titanium nitride film 58 in the region from which the first silicon nitride film 52 has been removed (FIG. 17). The copper film 63 is an example of the first metal film. The copper film 63 is formed by, for example, the CVD method.

Next, a fifth silicon oxide film 64 is formed on the copper film 63 on the inner surface of the slit trench 62. The fifth silicon oxide film 64 is an example of the fifth insulating film.

Figure 18:
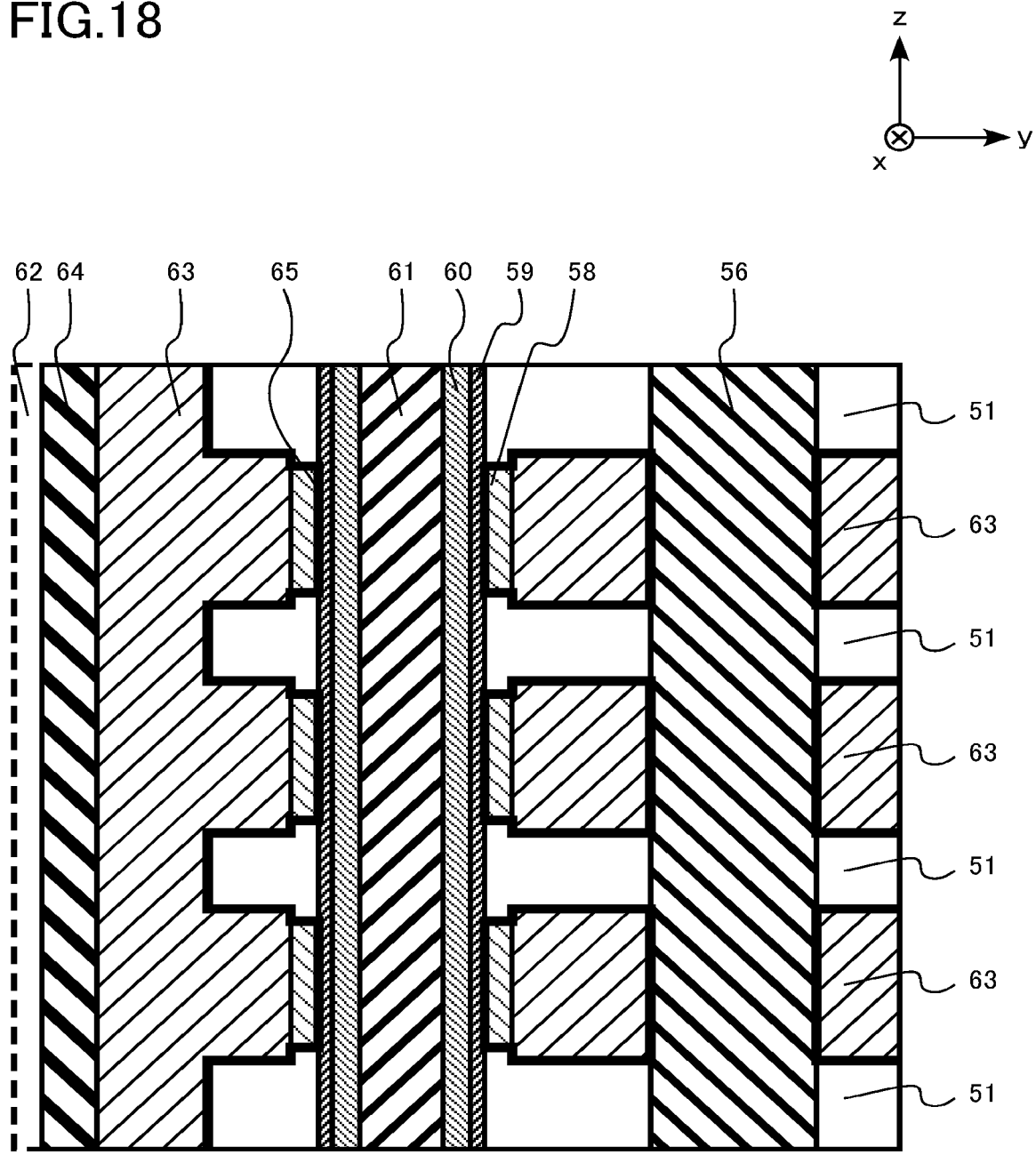
FIG. 18 is a schematic cross-sectional view showing a method of manufacturing the semiconductor memory device according to the embodiment.

Next, manganese diffusion annealing is performed (FIG. 18). The manganese diffusion annealing is an example of the first heat treatment. The manganese diffusion annealing is performed, for example, in an atmosphere containing argon and hydrogen. The temperature of the manganese diffusion annealing is, for example, equal to or more than 350° C. and equal to or less than 500° C.

By the manganese diffusion annealing, a region 65 containing manganese is formed between the first titanium nitride film 58 and the third silicon oxide film 59. The region 65 is also formed between the first titanium nitride film 58 and the first silicon oxide film 51, and between the copper film 63 and the first silicon oxide film 51.

Manganese diffuses in the first titanium nitride film 58 to form the region 65 containing manganese between the first titanium nitride film 58 and the third silicon oxide film 59. The region 65 containing manganese is manganese silicate. By forming the fifth silicon oxide film 64 on the copper film 63 on the inner surface of the slit trench 62, the diffusion of manganese in the first titanium nitride film 58 is promoted.

The diffusion of manganese stops by forming the region 65. In other words, the region 65 is formed in a self-aligned manner between the first titanium nitride film 58 and the third silicon oxide film 59. The region 65 is formed in a self-aligned manner between the first titanium nitride film 58 and the first silicon oxide film 51.

Figure 19:
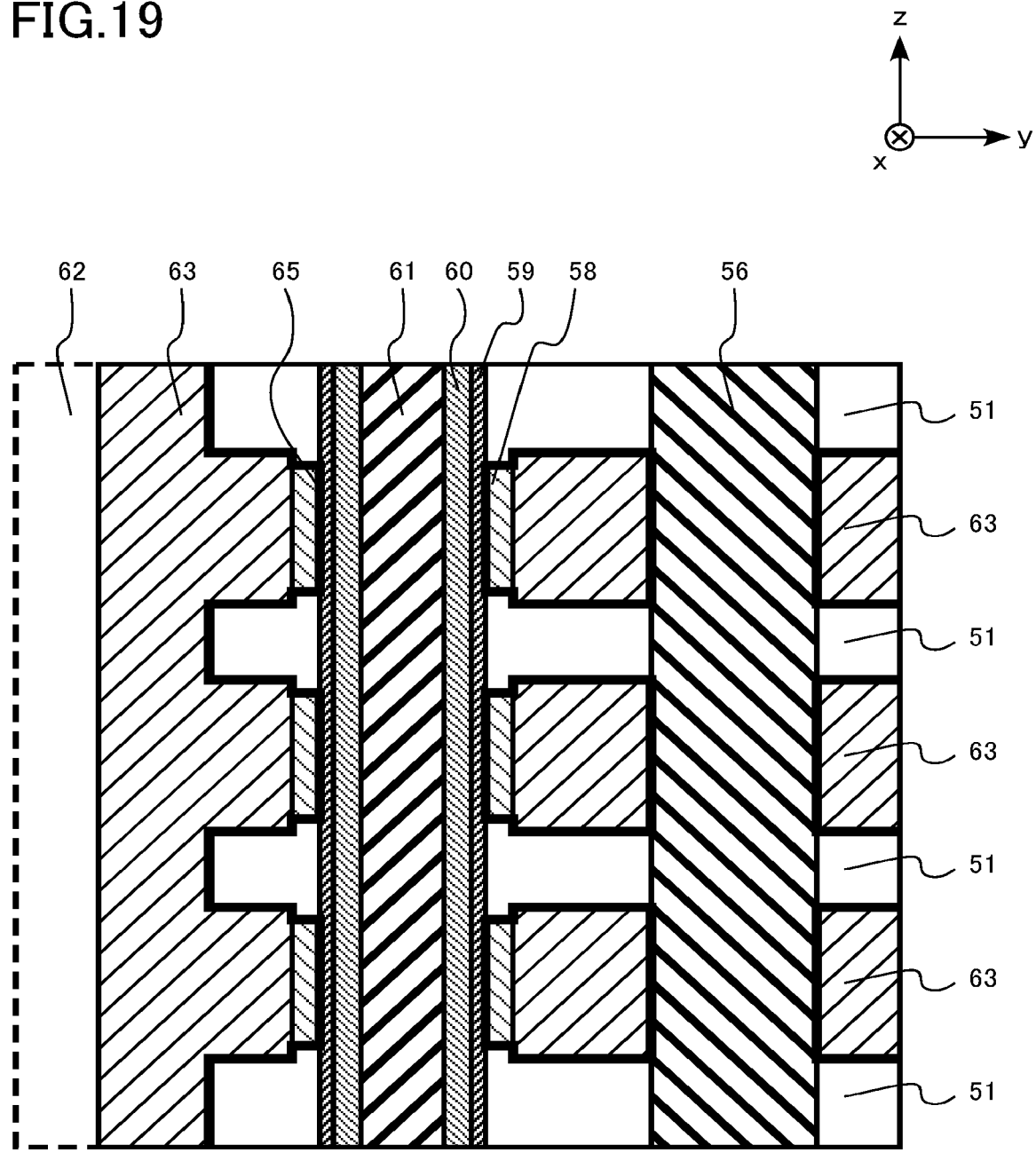
FIG. 19 is a schematic cross-sectional view showing a method of manufacturing the semiconductor memory device according to the embodiment.

Next, the fifth silicon oxide film 64 on the inner surface of the slit trench 62 is removed (FIG. 19). The fifth silicon oxide film 64 is removed by, for example, the wet etching method. The fifth silicon oxide film 64 is removed using, for example, dilute hydrofluoric acid.

Figure 20:
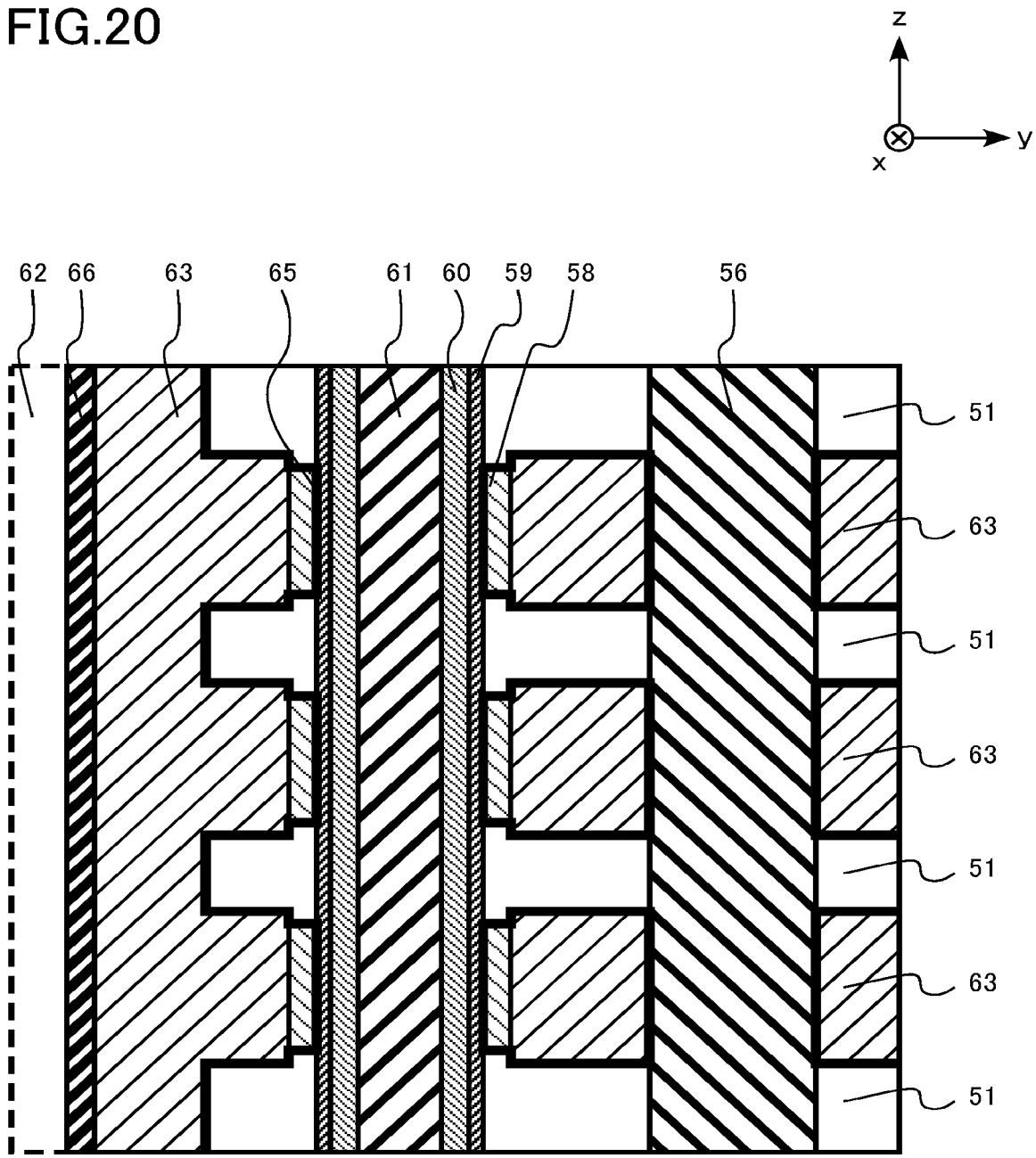
FIG. 20 is a schematic cross-sectional view showing a method of manufacturing the semiconductor memory device according to the embodiment.

Next, excess manganese discharge annealing is performed (FIG. 20). The excess manganese discharge annealing is an example of the second heat treatment. The excess manganese discharge annealing is performed, for example, in an atmosphere containing argon and hydrogen. The temperature of the excess manganese discharge annealing is, for example, equal to or more than 350° C. and equal to or less than 500° C.

By the excess manganese discharge annealing, an oxide film 66 containing manganese is formed on the copper film 63 on the inner surface of the slit trench 62. The oxide film 66 is formed by reaction between residual oxygen in the heat treatment furnace and excess manganese remaining in the copper film 63. By the excess manganese discharge annealing, the excess manganese remaining in the copper film 63 is removed.

Figure 21:
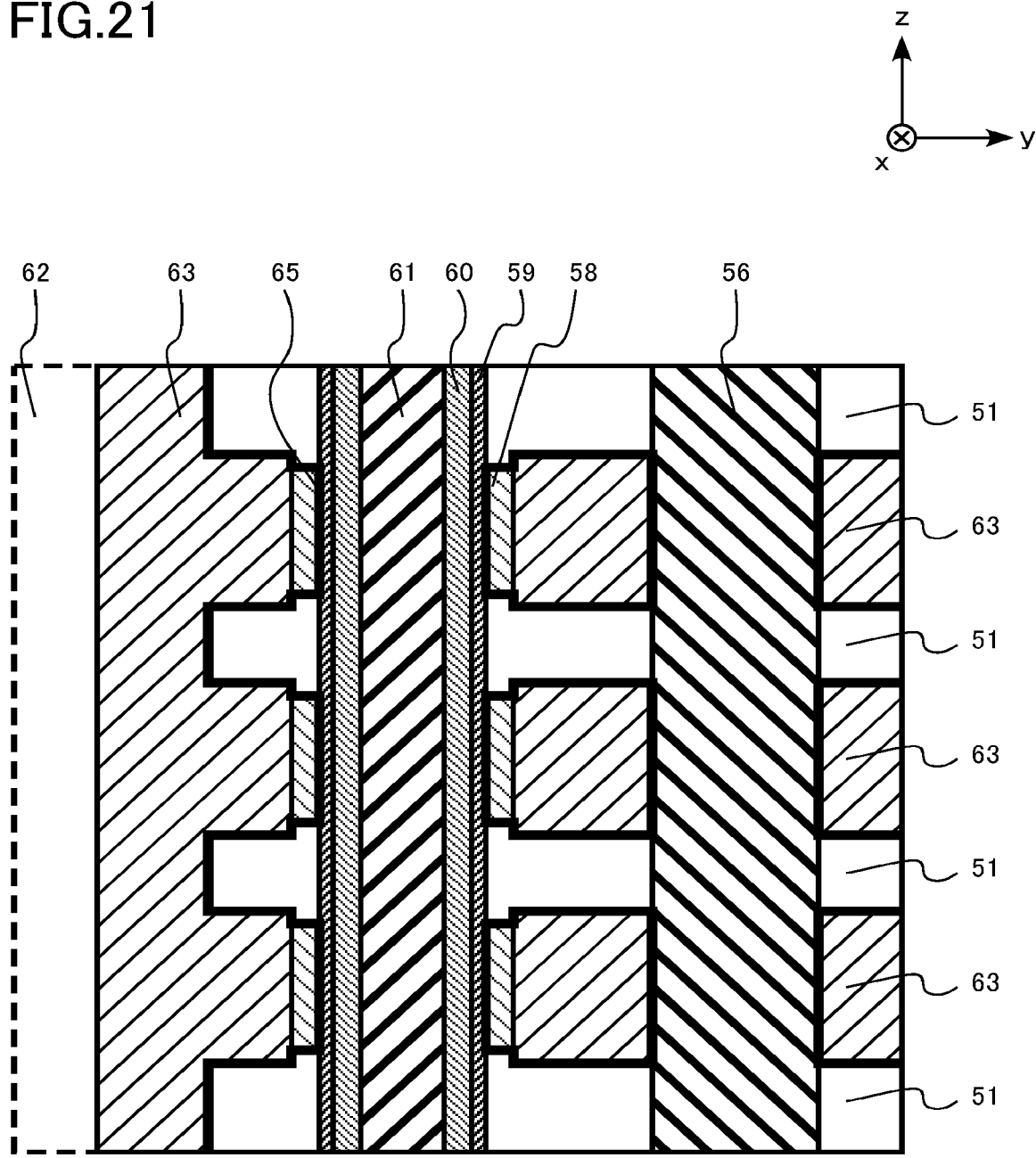
FIG. 21 is a schematic cross-sectional view showing a method of manufacturing the semiconductor memory device according to the embodiment.

Next, the oxide film 66 is removed (FIG. 21). The oxide film 66 is removed by, for example, the wet etching method. The oxide film 66 is removed using, for example, dilute hydrofluoric acid.

Figure 22:
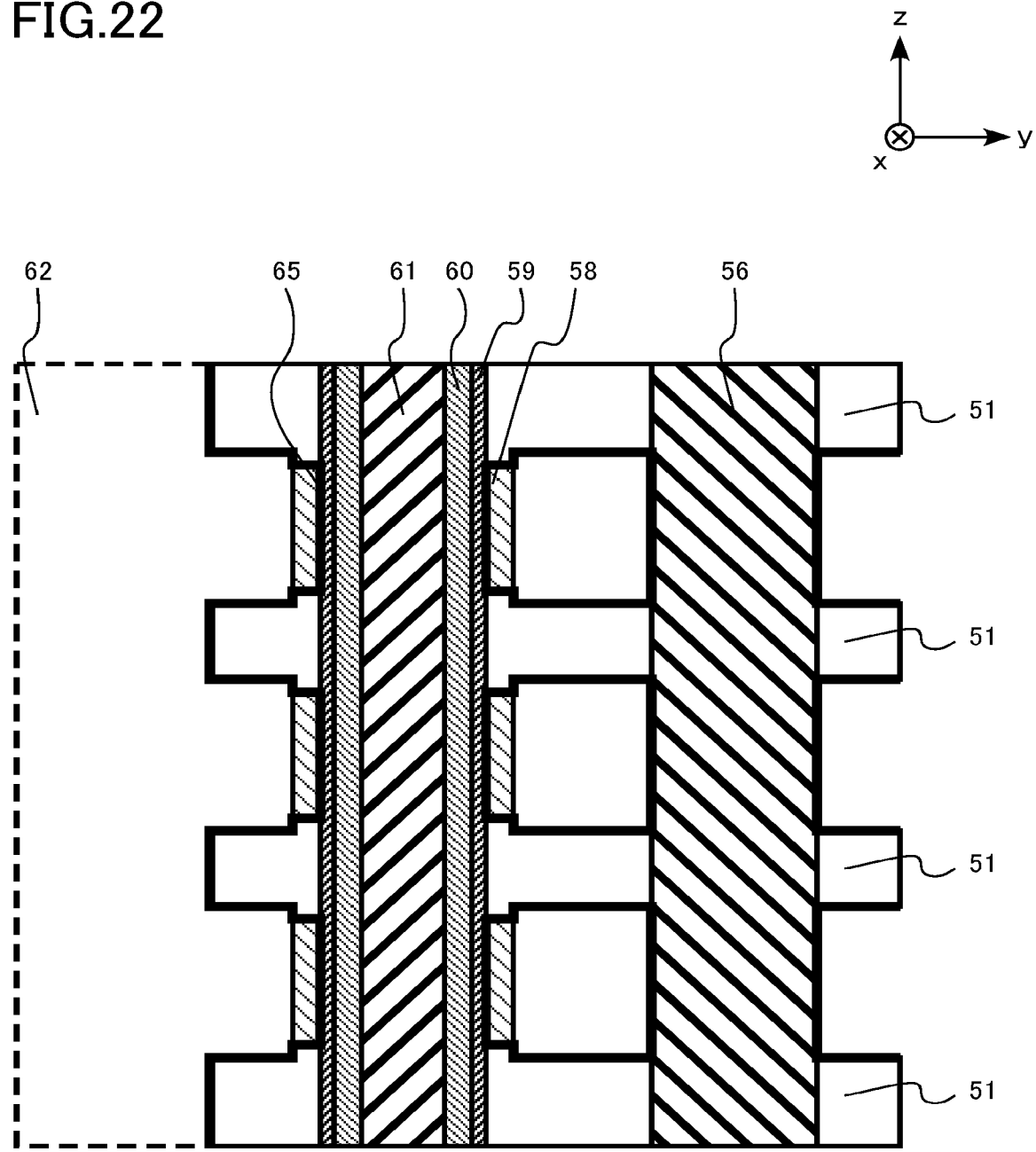
FIG. 22 is a schematic cross-sectional view showing a method of manufacturing the semiconductor memory device according to the embodiment.

Next, the copper film 63 is removed (FIG. 22). The copper film 63 is removed by, for example, the wet etching method. Since the excess manganese is removed, the copper film 63 can be etched by, for example, a treatment using ammonia.

Figure 23:
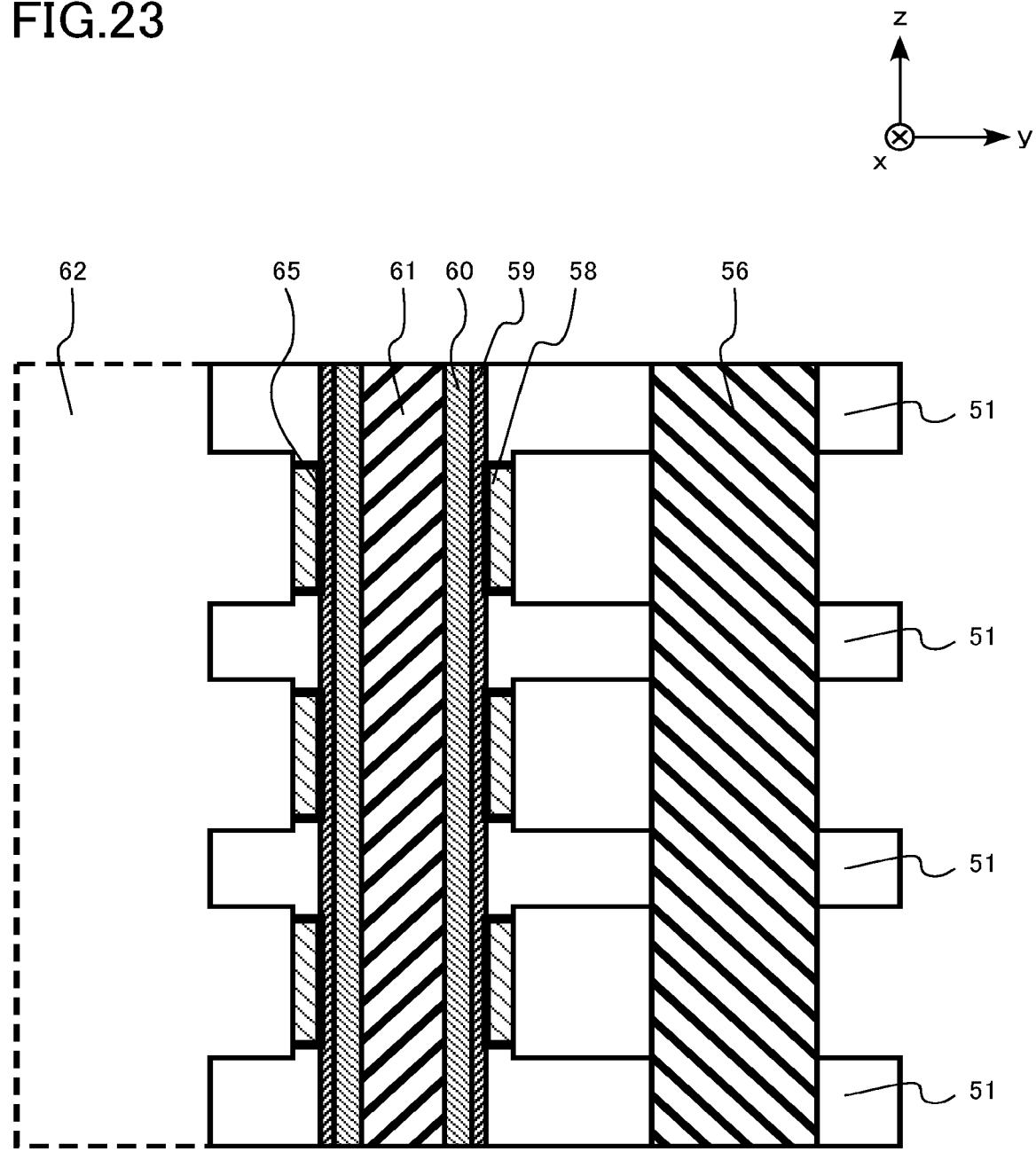
FIG. 23 is a schematic cross-sectional view showing a method of manufacturing the semiconductor memory device according to the embodiment.

Next, the region 65 containing manganese on the first silicon oxide film 51 is removed (FIG. 23). When the copper film 63 is etched, the region 65 is altered into a dentlite hydroxide. The region 65 having been altered is removed by, for example, the wet etching method. The region 65 having been altered is removed by, for example, dilute hydrochloric acid. Note that the region 65 between the first titanium nitride film 58 and the third silicon oxide film 59 remains as manganese silicate without being altered because the first titanium nitride film 58 serves as a protective film and is not exposed to the etching solution of the copper film 63.

Figure 24:
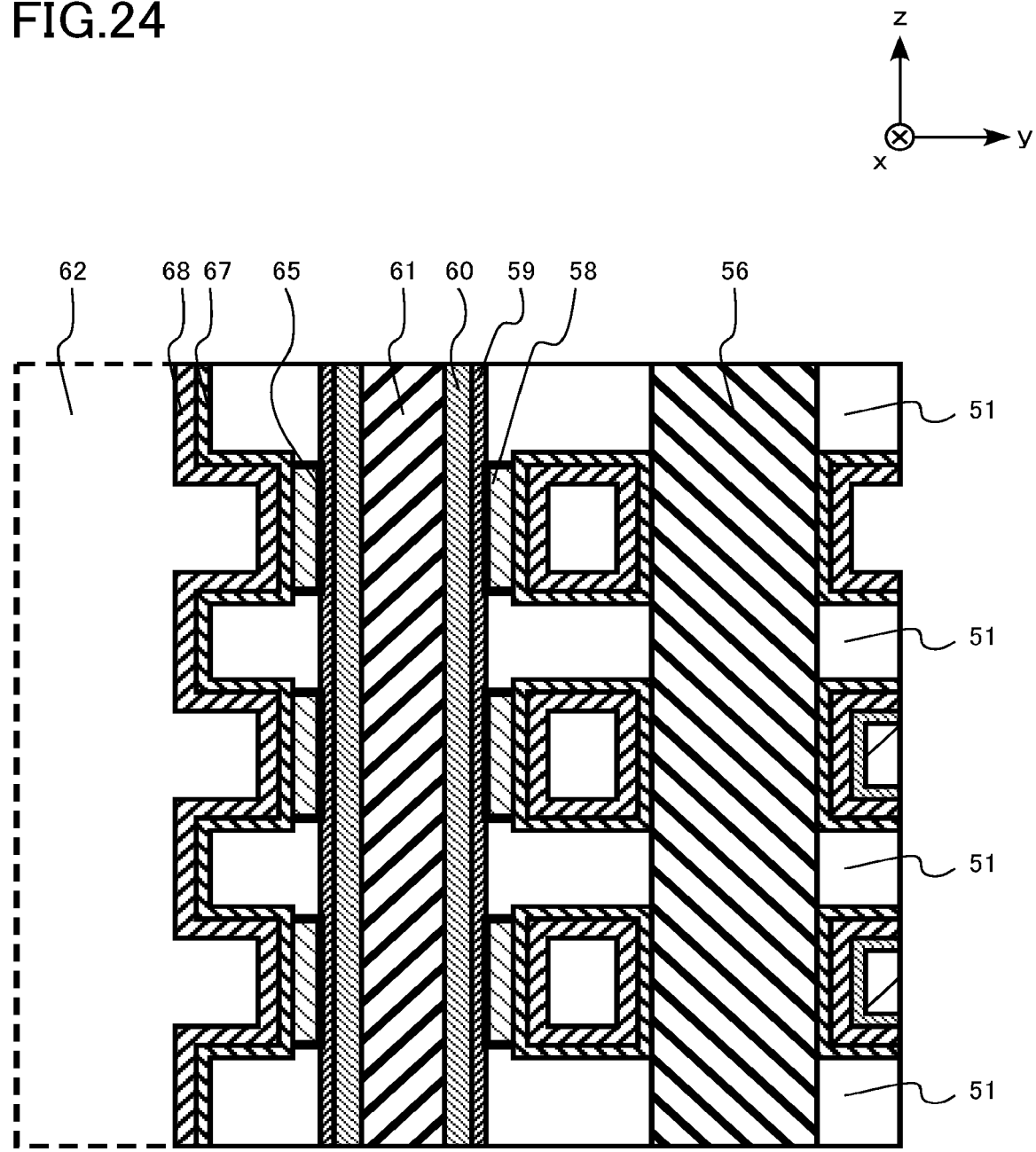
FIG. 24 is a schematic cross-sectional view showing a method of manufacturing the semiconductor memory device according to the embodiment.
Figure 25:
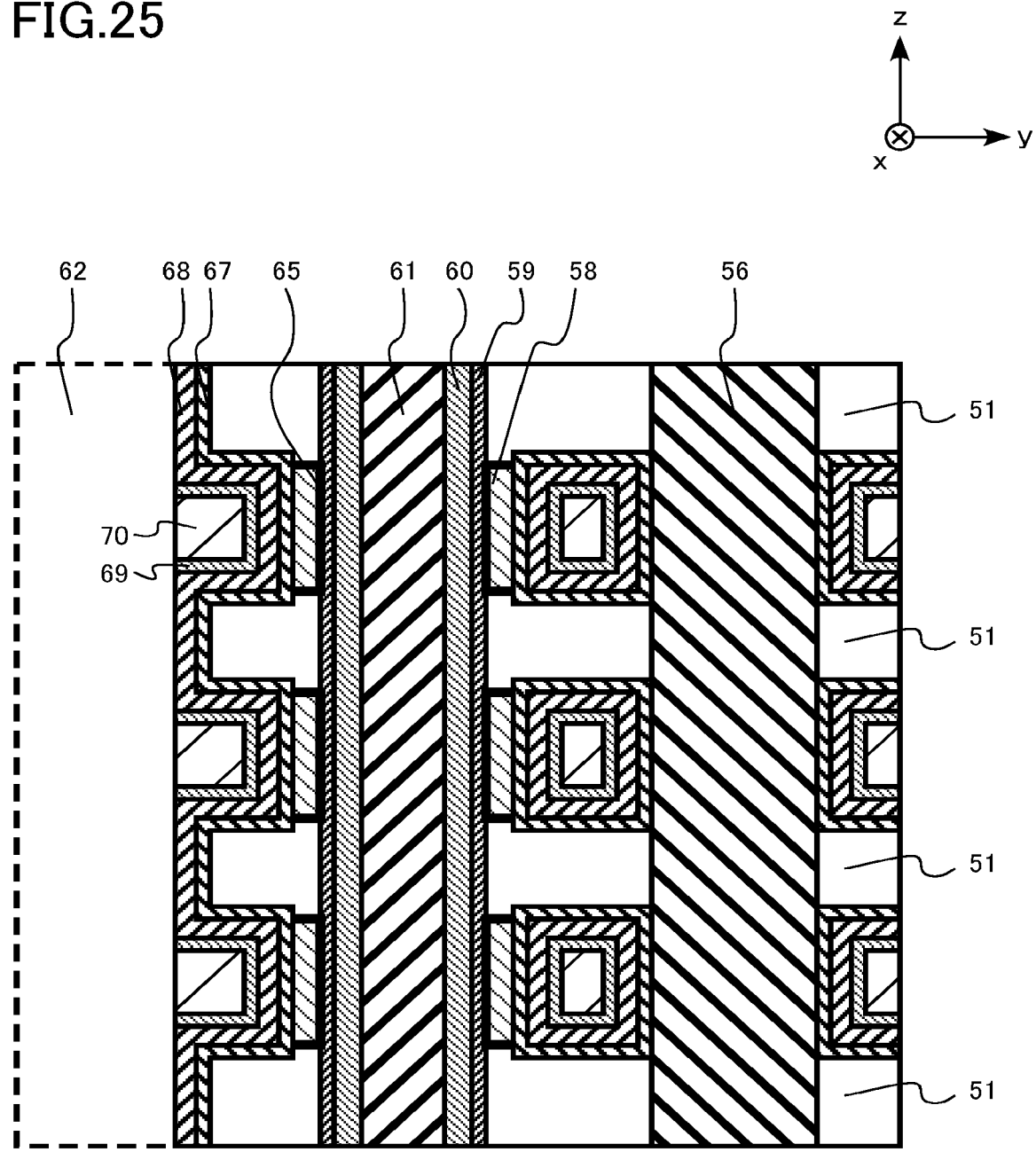
FIG. 25 is a schematic cross-sectional view showing a method of manufacturing the semiconductor memory device according to the embodiment.

Next, a second silicon nitride film 67 and a stacked film 68 of silicon oxide and aluminum oxide are formed on the first titanium nitride film 58 (FIG. 24). The stacked film 68 is an example of the fourth insulating film. The second silicon nitride film 67 and the stacked film 68 are formed by, for example, the CVD method. The second silicon nitride film 67 eventually becomes the barrier insulating layer 20. The stacked film 68 eventually becomes the block insulating layer 18.

Next, crystallization annealing is performed. The crystallization annealing is an example of the third heat treatment. The crystallization annealing is performed, for example, in an argon atmosphere. The temperature of the crystallization annealing is higher than the temperature of the manganese diffusion annealing. The temperature of the crystallization annealing is, for example, equal to or more than 900° C. and equal to or less than 1100° C. By the crystallization annealing, for example, aluminum contained in the stacked film 68 is crystallized.

Next, a second titanium nitride film 69 and a tungsten film 70 are formed on the stacked film 68. The second titanium nitride film 69 is an example of the second metal film. The second titanium nitride film 69 and the tungsten film 70 are formed by, for example, the CVD method.

Next, the second titanium nitride film 69 and the tungsten film 70 on the inner surface of the slit trench 62 are removed. The second titanium nitride film 69 and the tungsten film 70 are removed by, for example, the wet etching method. The second titanium nitride film 69 and the tungsten film 70 are removed using, for example, a mixed acid. The second titanium nitride film 69 eventually becomes the barrier metal layer 10x of the gate electrode layer 10. The tungsten film 70 eventually becomes the metal layer 10y of the gate electrode layer 10.

Then, the slit trench 62 is filled with, for example, a silicon oxide film not illustrated.

The memory cell array 101 of the three-dimensional NAND flash memory 100 of the embodiment is manufactured by the above manufacturing method.

As a modification of the above manufacturing method, it is possible to use a stacked film of a film containing manganese and a copper film, instead of the copper film 63 containing manganese, as the first metal film. In this case, a metal manganese film is formed by the CVD method so as to come into contact with the first titanium nitride film 58, for example. Then, a copper film is formed on the metal manganese film.

Similarly to the above manufacturing method, the copper film 63 is removed after the region 65 is formed. Then, the metal manganese film on the first titanium nitride film 58 is selectively removed with respect to the first titanium nitride film 58 using a surfactant. Then, the memory cell array 101 is manufactured by a method similar to the above manufacturing method.

Next, functions and effects of the semiconductor memory device and the method of manufacturing the semiconductor memory device of the embodiment will be described.

A three-dimensional NAND flash memory in which memory cells are three-dimensionally disposed achieves high integration and low cost. A memory cell of a three-dimensional NAND flash memory includes a charge storage layer for retaining charges. In order to improve the performance of a three-dimensional NAND flash memory, it has been studied application of a layer containing a metal element to the charge storage layer. For example, by applying a layer containing a metal element to the charge storage layer, the write voltage of data is reduced, and achievement of voltage reduction in the operating voltage can be expected.

On the other hand, when a layer containing a metal element is applied to the charge storage layer, there is a concern about diffusion of the metal element contained in the charge storage layer and deterioration of the reliability of the three-dimensional NAND flash memory. In particular, for example, there is a concern about diffusion of the metal element during high-temperature annealing such as crystallization annealing for crystallizing the block insulating layer.

For example, the metal element contained in the charge storage layer diffuses into the tunnel insulating layer, and there is a concern about an increase in leakage current of the tunnel insulating layer and a decrease in breakdown voltage of the tunnel insulating layer. When the leakage current of the tunnel insulating layer increases, for example, charge retention characteristics degrade. For example, the metal element contained in the charge storage layer diffuses into the block insulating layer, and there is concern about an increase in leakage current of the block insulating layer and a decrease in dielectric breakdown voltage of the block insulating layer.

The three-dimensional NAND flash memory 100 of the embodiment is provided with a barrier region 22 between the charge storage layer 16 and the tunnel insulating layer 14. A first region 22a of the barrier region 22 is provided between the charge storage layer 16 and the tunnel insulating layer 14. The first region 22a is a region containing manganese (Mn), silicon (Si), and oxygen (O). The first region 22a is, for example, manganese silicate. The first region 22a has a high diffusion barrier property with respect to the metal element, and suppresses the metal element contained in the charge storage layer 16 from diffusing into the tunnel insulating layer 14.

The three-dimensional NAND flash memory 100 of the embodiment is provided with a second region 22b of the barrier region 22 between the charge storage layer 16 and the first interlayer insulating layer 26a. Furthermore, a third region 22c of the barrier region 22 is provided between the charge storage layer 16 and the second interlayer insulating layer 26b. The second region 22b and the third region 22c have a high diffusion barrier property with respect to the metal element, and suppresses the metal element contained in the charge storage layer 16 from diffusing into the tunnel insulating layer 14 via the first interlayer insulating layer 26a or the second interlayer insulating layer 26b.

According to the three-dimensional NAND flash memory 100 of the embodiment, by including the barrier region 22, the metal element contained in the charge storage layer 16 is suppressed from diffusing into the tunnel insulating layer 14. Therefore, the three-dimensional NAND flash memory 100 with improved reliability can be achieved.

The three-dimensional NAND flash memory 100 of the embodiment is provided with the barrier insulating layer 20 between the charge storage layer 16 and the block insulating layer 18. The barrier insulating layer 20 contains silicon (Si) and nitrogen (N). The barrier insulating layer 20 is, for example, silicon nitride. The barrier insulating layer 20 prevents the metal element contained in the charge storage layer 16 from diffusing into the block insulating layer 18.

According to the three-dimensional NAND flash memory 100 of the embodiment, by including the barrier insulating layer 20, the metal element contained in the charge storage layer 16 is suppressed from diffusing into the block insulating layer 18. Therefore, the three-dimensional NAND flash memory 100 with improved reliability can be achieved.

Since the charge storage layer 16 is surrounded by the barrier region 22 and the barrier insulating layer 20, the three-dimensional NAND flash memory 100 of the embodiment can effectively suppress diffusion of the metal element from the charge storage layer 16.

From the viewpoint that the memory cell includes a sufficient charge storage amount, the thickness of the charge storage layer 16 in the y direction is preferably equal to or more than 2 nm, and more preferably equal to or more than 3 nm. From the viewpoint of scaling-down of the memory cell, the thickness of the charge storage layer 16 in the y direction is preferably equal to or less than 20 nm, and more preferably equal to or less than 10 nm.

The charge storage layer 16 is preferably titanium nitride or tantalum nitride because it is easy to manufacture, has high oxidation resistance, and can increase the charge storage amount.

From the viewpoint of increasing the charge storage amount, the charge storage layer 16 preferably contains manganese (Mn).

According to the method of manufacturing the three-dimensional NAND flash memory 100 of the embodiment, the barrier region 22 can be formed in a self-aligned manner between the charge storage layer 16 and the tunnel insulating layer 14. Therefore, it is possible to stably manufacture the three-dimensional NAND flash memory 100 with improved reliability.

In the embodiment, the memory cell array structure in which the semiconductor layer 12 functioning as a channel is provided between the two electrically separated gate electrode layers 10 has been described by way of example.

However, the memory cell array structure of the three-dimensional NAND flash memory is not limited to the memory cell array structure of the embodiment. For example, it is also possible to adopt a memory cell array structure in which a semiconductor layer functioning as a channel penetrates a plate-like gate electrode layer and is surrounded by the gate electrode layer.

While certain embodiments have been described, these embodiments have been presented by way of example only, and are not intended to limit the scope of the inventions. Indeed, a semiconductor memory device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first interlayer insulating layer and a second interlayer insulating layer arranged in a first direction;
   a gate electrode layer provided between the first interlayer insulating layer and the second interlayer insulating layer;
   a semiconductor layer extending in the first direction and facing the gate electrode layer in a second direction intersecting the first direction;
   a first insulating layer provided between the gate electrode layer and the semiconductor layer;
   a charge storage layer provided between the gate electrode layer and the first insulating layer and containing a metal element;
   a second insulating layer provided between the gate electrode layer and the charge storage layer;
   a first region provided between the charge storage layer and the first insulating layer and containing manganese (Mn), silicon (Si), and oxygen (O),
   a second region provided between the charge storage layer and the first interlayer insulating layer, and containing manganese (Mn), silicon (Si), and oxygen (O); and
   a third region provided between the charge storage layer and the second interlayer insulating layer, and containing manganese (Mn), silicon (Si), and oxygen (O).

2. The semiconductor memory device according to claim 1 further comprising: a third insulating layer provided between the second insulating layer and the charge storage layer, and containing silicon (Si) and nitrogen (N).

3. The semiconductor memory device according to claim 1, wherein the charge storage layer contains nitrogen (N).

4. The semiconductor memory device according to claim 1, wherein the charge storage layer contains manganese (Mn).

5. The semiconductor memory device according to claim 1, wherein a thickness of the charge storage layer in a second direction is equal to or more than 2 nm.

6. The semiconductor memory device according to claim 1, wherein a thickness of the charge storage layer in the second direction is thicker than a thickness of the first insulating layer in the second direction.

7. The semiconductor memory device according to claim 1, wherein the first insulating layer contains silicon (Si) and oxygen (O).

8. The semiconductor memory device according to claim 1, wherein the second insulating layer contains aluminum (Al) and oxygen (O).

9. The semiconductor memory device according to claim 1, wherein the first interlayer insulating layer and the second interlayer insulating layer contain silicon (Si) and oxygen (O).

10. The semiconductor memory device according to claim 1, wherein the metal element is at least one metal element selected from the group consisting of titanium (Ti), tantalum (Ta), and aluminum (Al).

11. The semiconductor memory device according to claim 10, wherein the charge storage layer contains nitrogen (N).

* * * * *